(12) United States Patent
Nevirkovets et al.

(10) Patent No.: US 7,977,668 B2
(45) Date of Patent: Jul. 12, 2011

(54) MULTILAYER STRUCTURE WITH ZIRCONIUM-OXIDE TUNNEL BARRIERS AND APPLICATIONS OF SAME

(75) Inventors: Ivan Nevirkovets, Evanston, IL (US); John Ketterson, Evanston, IL (US); Oleksandr Chernyashevskyy, Evanston, IL (US); Serhii Shafraniuk, Evanston, IL (US)

(73) Assignee: Northwestern University, Evanston, IL (US)

( * ) Notice: Subject to any disclaimer, the term of this patent is extended or adjusted under 35 U.S.C. 154(b) by 261 days.

(21) Appl. No.: 12/126,726

(22) Filed: May 23, 2008

(65) Prior Publication Data

US 2009/0057652 A1    Mar. 5, 2009

Related U.S. Application Data

(60) Provisional application No. 60/931,453, filed on May 23, 2007.

(51) Int. Cl.
*H01L 29/72*    (2006.01)
(52) U.S. Cl. ............... 257/31; 257/30; 257/32; 257/35
(58) Field of Classification Search .......... 257/30, 257/31, 32, 35
See application file for complete search history.

(56) References Cited

U.S. PATENT DOCUMENTS

| | | | |
|---|---|---|---|
| 4,157,555 A | 6/1979 | Gray | |
| 4,334,158 A | 6/1982 | Faris | |
| 4,490,733 A | 12/1984 | Kroger | |
| 5,019,530 A | 5/1991 | Kleinsasser et al. | |
| 5,477,061 A | 12/1995 | Morohashi | |
| 6,475,857 B1 * | 11/2002 | Kim et al. | 438/240 |
| 6,528,814 B1 * | 3/2003 | Frank et al. | 257/30 |
| 6,624,490 B2 | 9/2003 | Flatte et al. | |
| 6,784,451 B2 | 8/2004 | Amin et al. | |
| 2004/0051152 A1 * | 3/2004 | Nakajima | 257/411 |

OTHER PUBLICATIONS

Shafranjuk, S.E. et al., "Collective Oscillations of the Superconducting Gap of Multilayered Josephson Junctions," Physical Review, 2005, p. 212506-212506-4, vol. B 72.
Shafranjuk, S.E. et al., "Two-Qubit Gate Based on a Multiterminal Double-Barrier Josephson Junctions," Physical Review, 2006, p. 024521-024521-9, vol. B 74.

* cited by examiner

*Primary Examiner* — Edward Wojciechowicz
(74) *Attorney, Agent, or Firm* — Morris Manning Martin LLP; Tim Tingkang Xia, Esq.

(57) ABSTRACT

A multilayer structure with zirconium-oxide tunnel barriers. In one embodiment, the multilayer structure includes a first niobium (Nb) layer, a second niobium (Nb) layer, and a plurality of zirconium-oxide tunnel barriers sandwiched between the first niobium (Nb) layer and the second niobium (Nb) layer, wherein the plurality of zirconium-oxide tunnel barriers is formed with N layers of zirconium-oxide, N being an integer greater than 1, and M layers of zirconium, M being an integer no less than N, such that between any two neighboring layers of zirconium-oxide, a layer of zirconium is sandwiched therebetween.

11 Claims, 9 Drawing Sheets

(a)

(b)

(a)

(b)

(c)

(a)

(b)

(c)

MULTILAYER STRUCTURE WITH ZIRCONIUM-OXIDE TUNNEL BARRIERS AND APPLICATIONS OF SAME

CROSS-REFERENCE TO RELATED PATENT APPLICATION

This application claims the benefit, pursuant to 35 U.S.C. §119(e), of U.S. provisional patent application Ser. No. 60/931,453, filed May 23, 2007, entitled "Zr-Based Single- and Multiple-Barrier Superconducting Tunnel Junctions, Two Qubit Gate, and Applications of Same," by John Ketterson et al., which is incorporated herein by reference in its entirety.

STATEMENT AS TO RIGHTS UNDER FEDERALLY-SPONSORED RESEARCH

This invention was made with Government support under Contract No. EIA0218652 awarded by National Science Foundation of the United States. Accordingly, the United States Government has certain rights in this invention pursuant to this grant.

Some references, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference was individually incorporated by reference. In terms of notation, hereinafter, "[n]" represents the nth reference cited in the reference list. For example, [11] represents the 11th reference cited in the reference list, namely, I. P. Nevirkovets, O. Chernyashevskyy, and J. B. Ketterson, Appl. Phys. Lett. 88, 212504 (2006).

FIELD OF THE INVENTION

The present invention relates generally to multilayer structure with zirconium-oxide tunnel barriers, and more particularly to a multilayer structure with highly homogeneous zirconium-oxide tunnel barriers and applications of same including a two qubit gate utilizing such a multilayer structure.

BACKGROUND OF THE INVENTION

Oxide barriers are an important component of superconducting and magnetic devices based on junctions utilizing electron tunneling. Uniformity of the tunnel barrier is crucial in obtaining reproducible tunnel junctions for use as memory elements in MRAM (Magnetoresistive random access memory) devices and in superconducting electronics based on Josephson and other effects. A component of such devices is an electron tunnel barrier, generally formed by oxidizing a metal. An oxide of zirconium, $ZrO_x$, has been experimented with as a barrier material. The technique by which it was formed did not allow one to obtain high quality barriers that are free of pinholes, where the latter degrade device performance by producing a leakage current. Typically, a few nanometer thick overlayer of Zr is deposited in a single step, followed by oxidization to form an insulating barrier. With this approach the initial Zr overlayer turns out to be polycrystalline, and when oxidized it produces an inhomogeneous oxide; the resultant junctions then have a high leakage current. To overcome this drawback and to have the overlayer amorphous, some workers have alloyed Zr with another metal such as Al. This technique has the disadvantage of introducing into the multilayer structure a "soft" metal with a low melting temperature, and the need to precisely control the alloy composition for reproducibility.

In particular, At present, the most popular material used in tunnel barriers is $AlO_x$; however it is based on a "soft" metal Al, which poses problems for the formation of robust, high-quality junctions based on refractory metals or other electrode materials that require high-temperature processing. There is a similar problem with $MgO_x$ barriers, which have also been tried as tunnel junctions. Zr forms a thermally stable oxide. $ZrO_2$, which melts about 3000° C. Zr overlayers (deposited to form artificial barriers [1-3]) are known to be polycrystalline, so that, on being thermally oxidized, they produce a spatially inhomogeneous oxide, $ZrO_x$ [4], and the resultant junctions have high leakage currents. This property is a considerable drawback for using $ZrO_x$ in practical tunnel junctions. Proposals to improve the Zr barrier quality include the addition some other metals, such as Al, as an overlayer on the Zr [4-10]; however, it is understood that high-quality junctions have not been demonstrated within this approach.

Moreover, multiply oxidized Al barriers were reported for both superconducting and magnetic junctions [12-16]; however, it is understood that there has not been any publication on multiply oxidized Zr-based barriers.

Therefore, a heretofore unaddressed need exists in the art to address the aforementioned deficiencies and inadequacies.

SUMMARY OF THE INVENTION

The present invention, in one aspect, relates to a multilayer structure with zirconium-oxide tunnel barriers. In one embodiment, the multilayer structure includes a first niobium (Nb) layer, a second niobium (Nb) layer, and a plurality of zirconium-oxide tunnel barriers sandwiched between the first niobium (Nb) layer and the second niobium (Nb) layer, wherein the plurality of zirconium-oxide tunnel barriers is formed with N layers of zirconium-oxide, N being an integer greater than 1, and M layers of zirconium, M being an integer no less than N, such that between any two neighboring layers of zirconium-oxide, a layer of zirconium is sandwiched therebetween.

In one embodiment, each layer of zirconium-oxide is formed by oxidizing a layer of zirconium that is deposited on another layer of zirconium or one of the first niobium (Nb) layer and the second niobium (Nb) layer, and wherein the oxidation of a layer of zirconium is performed at a range of rate about 150 to 1500 Pa s.

Each of the first niobium (Nb) layer and the second niobium (Nb) layer has a thickness, D, in the range of about 50 to 200 nm. Moreover, each of N layers of zirconium-oxide and M layers of zirconium has a thickness, d, which satisfies the relationship $D/d \geq 10$, wherein d is from 1 mono-atomic layer to 0.5 nm.

The multilayer structure further has a substrate, and wherein the first niobium (Nb) layer is deposited on the substrate.

In another aspect, the present invention relates to a multilayer structure with zirconium-oxide tunnel barriers. In one embodiment, the multilayer structure has a first layer of metallic material, a second layer of metallic material, and a plurality of zirconium-oxide tunnel barriers sandwiched between the first layer of metallic material and the second layer of metallic material, wherein the plurality of zirconium-oxide tunnel barriers is formed with N layers of zirconium-oxide, N being an integer greater than 1, and M layers of zirconium, M being an integer no less than N, such that between any two neighboring layers of zirconium-oxide, a layer of zirconium is sandwiched therebetween.

In one embodiment, each layer of zirconium-oxide is formed on a layer of zirconium or one of the first layer of metallic material and the second layer of metallic material. Moreover, each of the first layer of metallic material and the second layer of metallic material has a thickness, D, in the range of about 50 to 200 nm. Furthermore, each of N layers of zirconium-oxide and M layers of zirconium has a thickness, d, which satisfies the relationship $D/d \geq 10$, wherein d is from 1 mono-atomic layer to 0.5 nm.

The multilayer structure further has a substrate, and wherein the first layer of metallic material is deposited on the substrate.

In one embodiment, each of the first layer of metallic material and the second layer of metallic material is selected from the group of metals consisting of niobium, niobium plus nitrogen, niobium plus tin, vanadium plus silicon, niobium plus nitrogen and carbon, niobium plus germanium, and niobium plus germanium and silicon.

In a further aspect, the present invention relates to a method for making a multilayer structure with zirconium-oxide tunnel barriers. In one embodiment, the method has the steps of providing a first niobium (Nb) layer, providing a second niobium (Nb) layer, and forming a plurality of zirconium-oxide tunnel barriers sandwiched between the first niobium (Nb) layer and the second niobium (Nb) layer.

The plurality of zirconium-oxide tunnel barriers is formed with N layers of zirconium-oxide, N being an integer greater than 1, and M layers of zirconium, M being an integer no less than N, such that between any two neighboring layers of zirconium-oxide, a layer of zirconium is sandwiched therebetween.

In one embodiment, each layer of zirconium-oxide is formed by oxidizing a layer of zirconium that is deposited on another layer of zirconium or one of the first niobium (Nb) layer and the second niobium (Nb) layer, and wherein the oxidation of a layer of zirconium is performed at a range of rate about 150 to 1500 Pa s.

The method further comprises the step of providing a substrate, wherein the first niobium (Nb) layer is deposited on the substrate.

In yet another aspect, the present invention relates to a two-qubit gate. In one embodiment, the two-qubit gate has a double barrier Josephson junction structure, which has a first superconductor layer, a second superconductor layer, a first insulating barrier sandwiched between the first superconductor layer and the second superconductor layer, a third superconductor layer that is spatially positioned closer to the second superconductor layer than to the first superconductor layer, and a second insulating barrier sandwiched between the second superconductor layer and the third superconductor layer.

The two-qubit gate further has a first terminal formed on the first superconductor layer, a second terminal formed on the second superconductor layer, and a third terminal formed on the third superconductor layer, wherein when an external potential is applied to the double barrier Josephson junction structure, a first super current flows between the first terminal and the second terminal through the first insulating barrier with a first phase difference, and a second super current flows between the second terminal and the third terminal through the second insulating barrier with a second phase difference, respectively.

In one embodiment, each of the first superconductor layer, the second superconductor layer and the third superconductor layer comprises a layer of zirconium, and each of the first insulating barrier and the second insulating barrier comprises a layer of zirconium-oxide, respectively.

In another embodiment, each of the first superconductor layer, the second superconductor layer and the third superconductor layer comprises a layer of metallic material that is selected from the group of metals consisting of niobium, niobium plus nitrogen, niobium plus tin, vanadium plus silicon, niobium plus nitrogen and carbon, niobium plus germanium, and niobium plus germanium and silicon, and each of the first insulating barrier and the second insulating barrier comprises a layer of the zirconium-oxide, respectively.

In yet another embodiment, each of the first superconductor layer, the second superconductor layer and the third superconductor layer comprises a layer of metallic material that is selected from the group of metals consisting of niobium, niobium plus nitrogen, niobium plus tin, vanadium plus silicon, niobium plus nitrogen and carbon, niobium plus germanium, and niobium plus germanium and silicon, and each of the first insulating barrier and the second insulating barrier comprises a layer of the oxidized metallic material, respectively.

These and other aspects of the present invention will become apparent from the following description of the preferred embodiment taken in conjunction with the following drawings, although variations and modifications therein may be affected without departing from the spirit and scope of the novel concepts of the disclosure.

DETAILED DESCRIPTION OF THE INVENTION

Figure 1:
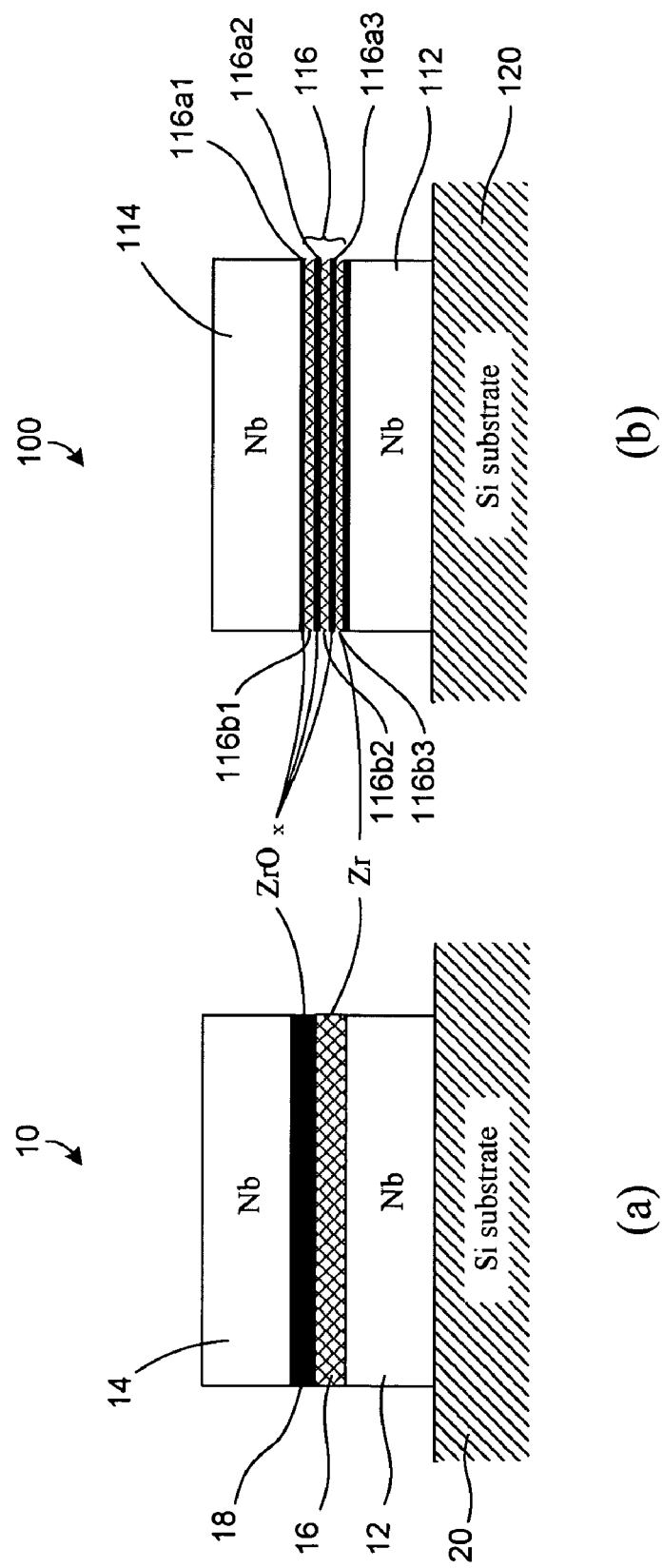
FIG. 1. Schematic cross-sectional view of Nb/Zr tunnel junctions fabricated using single (a) and multiple (b) oxidation process according to one embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like parts throughout the views. As used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which has no influence on the scope of the invention. Additionally, some terms used in this specification are more specifically defined below.

Definitions

The terms used in this specification generally have their ordinary meanings in the art, within the context of the invention, and in the specific context where each term is used.

Certain terms that are used to describe the invention are discussed below, or elsewhere in the specification, to provide additional guidance to the practitioner in describing the apparatus and methods of the invention and how to make and use them. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that the same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification, including examples of any terms discussed herein, is illustrative only, and in no way limits the scope and meaning of the invention or of any exemplified term. Likewise, the invention is not limited to various embodiments given in this specification. Furthermore, subtitles may be used to help a reader of the specification to read through the specification, which the usage of subtitles, however, has no influence on the scope of the invention.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the term "quantum well" refers to a situation that when a particle (like electron or hole) is confined in a potential well, and the de Broglie wavelength of the particle is comparable or less than the width of the potential well, then the energy that the particle can acquire, becomes quantized. A Josephson junction can behave similarly to an ordinary particle in a quantum well. In a Josephson junction, the potential energy consists of a series of wells in dependence of the phase difference across the junction, and the phase difference behaves analogously to the spatial coordinate of an ordinary particle in a quantum well. That is, by analogy with a particle in a quantum well, the Josephson junction energy is quantized, and the junction can undergo transitions between the different energy levels within the same quantum well, or transitions between the energy levels located in the neighbor wells (quantum tunneling). The quantum well profile can be changed by a superconducting current flowing through the junction, namely, the current leads to a tilted potential called "washboard" potential. Because of existence of this periodic potential and the associated quantum levels, and a possibility to control the potential and the energy levels positions in it by a bias current, the Josephson junction can be operated as a qubit. The abovementioned transitions between the levels are used to manipulate the qubit state.

Overview of the Invention

The present invention, in one aspect, relates to a method of making a highly or substantially homogeneous zirconium-oxide tunnel barrier made by multiple steps, each step involving deposition of one, or a few, mono-atomic layers of zirconium which are subsequently oxidized, and a multilayer structure made by the method. One gist of the inventive method is that by depositing a very thin Zr layer, the crystalline size is reduced and the film approaches the amorphous limit. It is shown by the inventors experimentally that the multiple-step process indeed yields much better junction quality than the single-step process involving the oxidation of a thicker Zr film [11]. The $ZrO_x$ insulating barrier made by the inventive method will be useful for the fabrication of robust, high-quality junctions based on refractory metals or other electrode materials that require high-temperature processing.

Furthermore, as disclosed and shown experimentally in part in [11], a significant improvement of junction quality, in comparison with the usual practice where a thicker Zr overlayer is oxidized, results from multiply depositing very thin Zr layers followed by oxidization, yielding $ZrO_x$ barriers that approach the amorphous limit. Additionally, the current-voltage characteristics of the modified junctions do not display a proximity-effect feature; this is important for magnetic junctions where proximity effects deteriorate the magneto-resistance ratio.

Various unique features of the present invention will be made as to the embodiments of the present invention in conjunction with the accompanying drawings in FIGS. 1-9.

Referring to FIG. 1, the present invention, in one aspect, relates to a multilayer structure 100 with zirconium-oxide tunnel barriers, which is cross-sectionally shown in part in FIG. 1(b). In one embodiment, the multilayer structure 100 includes a first niobium (Nb) layer 112, a second niobium (Nb) layer 114 that is positioned apart from the first niobium (Nb) layer 112, and a plurality of zirconium-oxide tunnel barriers 116 formed and sandwiched between the first niobium (Nb) layer 112 and the second niobium (Nb) layer 114. The plurality of zirconium-oxide tunnel barriers 116 is formed with N layers of zirconium-oxide, N being an integer greater than 1, and M layers of zirconium, M being an integer no less than N, such that between any two neighboring layers of zirconium-oxide, a layer of zirconium is sandwiched therebetween. As such formed, each layer of zirconium-oxide functions as a tunnel barrier, and each interface between a layer of zirconium-oxide and a neighboring layer of zirconium functions as a junction or Josephson junction. Additionally, an interface between one of a layer of zirconium-oxide and a layer of zirconium and one of the first niobium (Nb) layer 112 and the second niobium (Nb) layer 114 also functions as a junction or Josephson junction.

In the embodiment as shown in FIG. 1(b), the plurality of zirconium-oxide tunnel barriers 116 is formed with three (i.e., N=3, which is greater than 1) layers of zirconium-oxide, 116a1, 116a2, and 116a3, and three (i.e., M=3) layers of zirconium, 116b1, 116b2, and 116b3. As formed, between any two neighboring layers of zirconium-oxide, for example, layer 116a1 and layer 116a2, a layer of zirconium is sandwiched therebetween, for example, layer 116b1 of zirconium sandwiched between layer 116a1 and layer 116a2.

In one embodiment, each layer of zirconium-oxide is formed by oxidizing a layer of zirconium that is deposited on another layer of zirconium or one of the first niobium (Nb) layer 112 and the second niobium (Nb) layer 114. For example, a layer of zirconium is deposited on layer 116b3 of zirconium and becomes layer 116a3 of zirconium-oxide after oxidation of that layer of zirconium. A layer of zirconium, i.e., layer 116b2, then is deposited on layer 116a3 of zirconium-oxide. Next, another layer of zirconium is deposited on layer 116b2 of zirconium and becomes layer 116a2 of zirconium-oxide after oxidation of that layer of zirconium. Additional layer or layers of zirconium-oxide and layer or layers of zirconium can be deposited accordingly. The oxidation of a layer of zirconium is performed at a range of rate about 150 to 1500 Pa s.

Each of the first niobium (Nb) layer 112 and the second niobium (Nb) layer 114 has a thickness, D, in the range of about 50 to 200 nm. The thickness of the first niobium (Nb) layer 112 can be same or different from the thickness of the second niobium (Nb) layer 114. In one embodiment as shown in FIG. 1(b), the thickness of the first niobium (Nb) layer 112 is about 7.7 nm, and the thickness of the second niobium (Nb) layer 114 is about 3.9 nm.

Moreover, each of N layers of zirconium-oxide and M layers of zirconium has a thickness, d, which satisfies the relationship $D/d \geq 10$, wherein d is from 1 mono-atomic layer to 0.5 nm. The thicknesses of N layers of zirconium-oxide and M layers of zirconium can be same or different from each other. Moreover, the thicknesses of N layers of zirconium-oxide can be same or different from each other, and the thicknesses of M layers of zirconium can also be same or different from each other. In one embodiment as shown in FIG. 1(b), the thickness of each of 3 layers of zirconium-oxide, 116a1, 116a2, and 116a3, is about 0.17 nm, and the thickness of each of 3 layers of zirconium, 116b1, 116b2, and 116b3, is also about 0.17 nm. In this particular example, the ratio of (D/d) has two values: 7.7/0.17=45, and 3.9/0.17=23, both of which are greater than 10.

The multilayer structure further has a substrate 120, and wherein the first niobium (Nb) layer 112 is deposited on the substrate 120. The substrate 120 normally is made from a semiconductor or an insulator material. In one embodiment as shown in FIG. 1(b), the substrate 120 is an Si substrate.

In another aspect, the present invention relates to a multilayer structure with zirconium-oxide tunnel barriers. In one embodiment, the multilayer structure has a first layer of metallic material, a second layer of metallic material, and a plurality of zirconium-oxide tunnel barriers sandwiched between the first layer of metallic material and the second layer of metallic material, wherein the plurality of zirconium-oxide tunnel barriers is formed with N layers of zirconium-oxide, N being an integer greater than 1, and M layers of zirconium, M being an integer no less than N, such that between any two neighboring layers of zirconium-oxide, a layer of zirconium is sandwiched therebetween. The main difference between this embodiment (not shown) and the embodiment shown in FIG. 1(b) is that instead of having a first niobium (Nb) layer 112, a second niobium (Nb) layer 114 that is positioned apart from the first niobium (Nb) layer 112, the multilayer structure has a first layer of metallic material and a second layer of metallic material. The metallic materials of the first layer and the second layer can be same or different from each other. In one embodiment, each of the first layer of metallic material and the second layer of metallic material is selected from the group of metals consisting of niobium, niobium plus nitrogen, niobium plus tin, vanadium plus silicon, niobium plus nitrogen and carbon, niobium plus germanium, and niobium plus germanium and silicon.

In one embodiment, each layer of zirconium-oxide is formed on a layer of zirconium or one of the first layer of metallic material and the second layer of metallic material, which can be made according to the procedure disclosed above in relation to the embodiment shown as FIG. 1(b). Moreover, each of the first layer of metallic material and the second layer 114 of metallic material has a thickness, D, in the range of about 50 to 200 nm. Furthermore, each of N layers of zirconium-oxide and M layers of zirconium has a thickness, d, which satisfies the relationship $D/d \geq 10$, wherein d is from 1 mono-atomic layer to 0.5 nm.

The multilayer structure further has a substrate, and wherein the first layer of metallic material is deposited on the substrate.

The multilayer structures of the present invention can find many applications. One of the applications is that they can be utilized as a part of two-qubit gate as further disclosed below.

Figure 4:
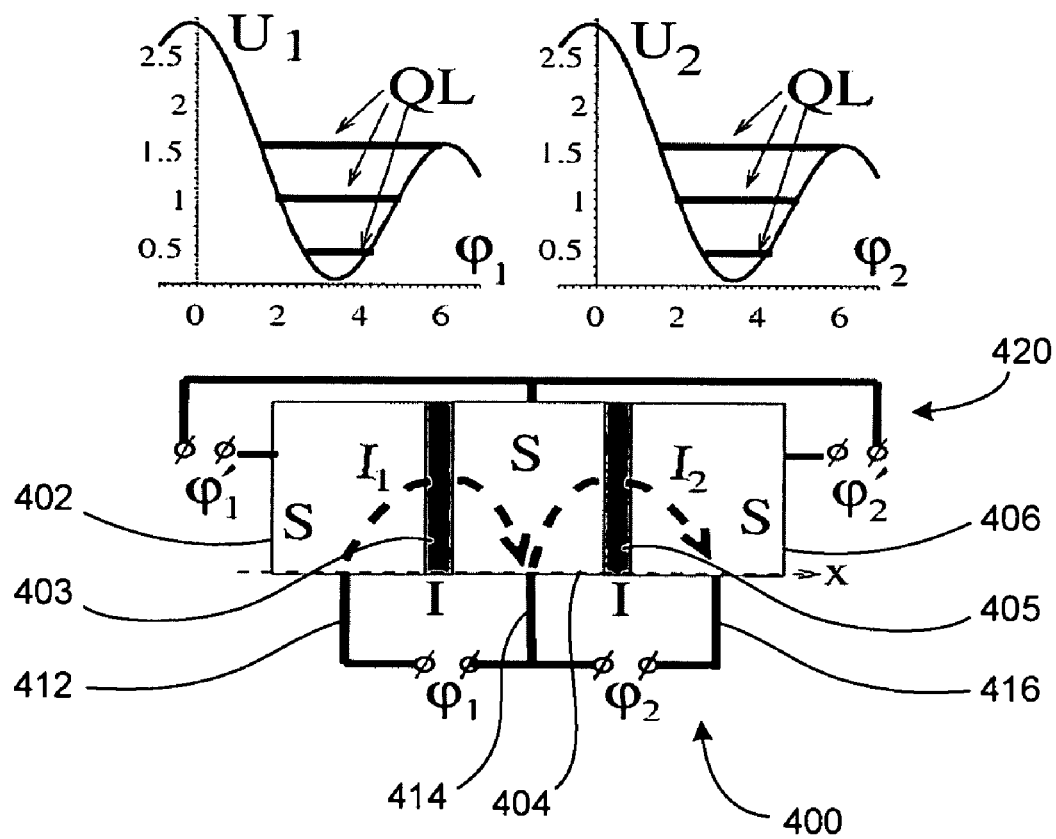
FIG. 4. The quantized levels (QL) formed inside the quantum wells $U_1$ and $U_2$ controlled by bias supercurrent $I_1$ and $I_2$ across the SIS subjunctions of a multiterminal SISIS junction according to one embodiment of the present invention. The phase differences $\phi_1$ and $\phi_2$ if transport supercurrents $II_{tr}$ flow along the S electrodes according to one embodiment of the present invention.

In yet another aspect, the present invention relates to a two-qubit gate. In one embodiment as shown in FIG. 4, a two-qubit gate has a double barrier Josephson junction structure, which has a first superconductor layer 402, a second superconductor layer 404, a first insulating barrier 403 sandwiched between the first superconductor layer 402 and the second superconductor layer 404, a third superconductor layer 406 that is spatially positioned closer to the second superconductor layer 404 than to the first superconductor layer 402, and a second insulating barrier 405 sandwiched between the second superconductor layer 404 and the third superconductor layer 406.

The two-qubit gate 400 further has a first terminal 412 formed on the first superconductor layer 402, a second terminal 414 formed on the second superconductor layer 404, and a third terminal 416 formed on the third superconductor layer 406. When an external potential or voltage 420 is applied to the double barrier Josephson junction structure, a first super current $I_1$ flows between the first terminal 412 and the second terminal 414 through the first insulating barrier 403 with a first phase difference $\phi_1$, and a second super current $I_2$ flows between the second terminal 414 and the third terminal 416 through the second insulating barrier 405 with a second phase difference $\phi_2$, respectively. Both of the first phase difference $\phi_1$ and the second phase difference $\phi_2$ are individually responsive to the external potential or voltage 420, respectively. The two-qubit gate 400 provides two individual qubits, where one is defined by the first superconductor layer 402 and the first insulating barrier 403 and the other is defined by the third superconductor layer 406 and the second insulating barrier 405, that are intrinsically coupled via the second superconductor layer 404 due to phase coherence between the first phase difference $\phi_1$ and the second phase difference $\phi_2$.

In one embodiment, each of the first superconductor layer 402, the second superconductor layer 404 and the third superconductor layer 406 is a layer of zirconium, and each of the first insulating barrier 403 and the second insulating barrier 405 is a layer of zirconium-oxide, respectively, which can be formed in a process as disclosed in connection with the embodiment shown in FIG. 1(b).

In another embodiment, each of the first superconductor layer 402, the second superconductor layer 404 and the third superconductor layer 406 is a layer of metallic material that is selected from the group of metals consisting of niobium, niobium plus nitrogen, niobium plus tin, vanadium plus silicon, niobium plus nitrogen and carbon, niobium plus germanium, and niobium plus germanium and silicon, and each of the first insulating barrier 403 and the second insulating barrier 405 is a layer of the zirconium-oxide, respectively.

In yet another embodiment, each of the first superconductor layer 402, the second superconductor layer 404 and the third superconductor layer 406 comprises a layer of metallic material that is selected from the group of metals consisting of niobium, niobium plus nitrogen, niobium plus tin, vanadium plus silicon, niobium plus nitrogen and carbon, niobium plus germanium, and niobium plus germanium and silicon, and each of the first insulating barrier 403 and the second insulating barrier 405 comprises a layer of the oxidized metallic material, respectively.

These and other aspects of the present invention are further described below.

EXAMPLES AND IMPLEMENTATIONS OF THE INVENTION

Without intent to limit the scope of the invention, exemplary methods and their related results according to the embodiments of the present invention are given below. Note again that titles or subtitles may be used in the examples for convenience of a reader, which in no way should limit the scope of the invention. Moreover, certain theories are proposed and disclosed herein; however, in no way they, whether they are right or wrong, should limit the scope of the invention.

Example One

Uniformity of the tunnel barrier is crucial in obtaining reproducible junctions for MRAM and superconducting electronics. It is known that a Zr overlayer (used to form artificial tunnel barrier) is typically polycrystalline, so that, on being thermally oxidized, it produces spatially inhomogeneous oxide $ZrO_x$ [4], and the resultant junctions have high leakage currents. This property is a considerable drawback for using $ZrO_x$ in practical tunnel junctions.

The junctions described in this disclosure were fabricated by applying standard Nb/Al SNEP (Selective Niobium Etching Process) and anodization techniques to Nb/Zr. The Nb/Zr multilayers were deposited onto oxidized Si substrates. Substrates of other materials can also be used. The base and top Nb layers were 130 nm and 110 nm thick, respectively, while the number of Zr layers and their thickness were varied for different deposition runs. The area of the junctions was 10×10 $\mu m^2$.

Figure 2:
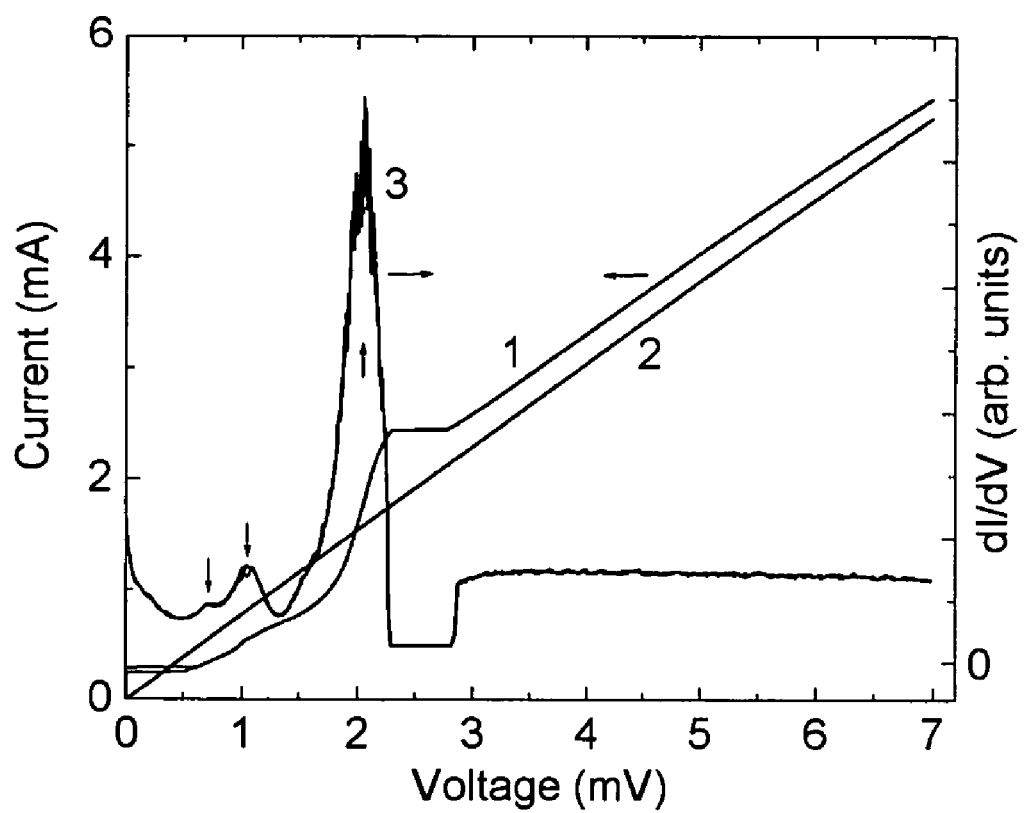
FIG. 2. Current-voltage characteristic of a Nb/Zr/ZrO$_x$/Zr/Nb junction at 4.2 K (curve 1) and at 9.1 K (curve 2). Curve 3 is the derivative for a current-voltage characteristic measured at 4.2 K in an applied magnetic field of 120 Oe. Vertical arrows correspond to voltages $2\Delta_{Nb}/3e$, $\Delta_{Nb}/e$, and $2\Delta_{Nb}/e$.

In a standard process, a Nb/Zr/$ZrO_x$/Zr/Nb junction schematically shown in FIG. 1a (cross-sectional view; not to scale) is fabricated. FIG. 2 shows current-voltage characteristics (CVC) of a Nb/Zr/$ZrO_x$/Zr/Nb junction (sample 1) for 4.2 K (curve 1) and for 9.1 K (curve 2). In this sample, the bottom Zr overlayer was nominally 7.7 nm thick; it was oxidized at the rate of 1200 Pa s and then covered by 3.9 nm Zr capping layer before deposition of the top Nb layer. The junction displays a Josephson current that can be completely suppressed in a weak magnetic field applied parallel to the junction plane. However, one can see that the higher-voltage portion of curve 2 lies below curve 1, implying a metallic rather than a tunnel junction. In addition, there is a large subgap conductivity and subharmonic structure in the subgap region; the latter is better seen in the dI/dV vs. V plot (curve 3), taken from the CVC measured in an applied magnetic field of 120 Oe. The vertical arrows correspond to voltages $2\Delta_{Nb}/3e$, $\Delta_{Nb}/e$, and $2\Delta_{Nb}/e$; here $\Delta_{Nb}$ is the superconducting energy gap of Nb [4]. A strong proximity effect also leads to a knee-like structure near $V=2\Delta_{Nb}/e$ (curve 2). Junctions of this type have poor on-chip normal-state resistance (and critical Josephson current) reproducibility.

Figure 3:
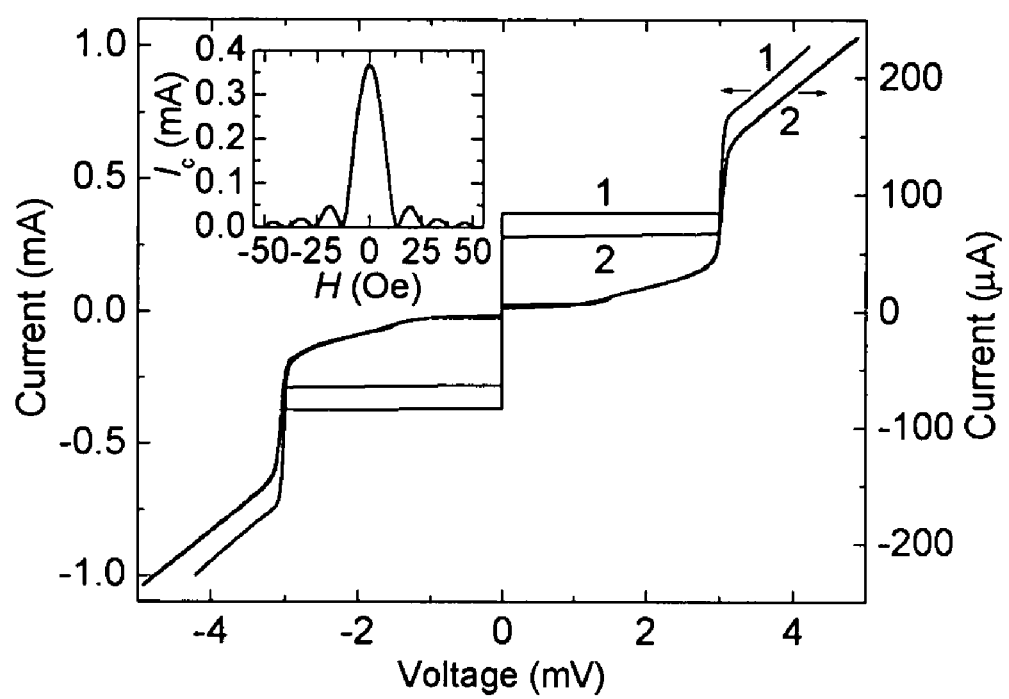
FIG. 3. CVC of a Nb/Zr/ZrO$_x$/Zr/ZrO$_x$/Zr/ZrO$_x$/Zr/Nb junction at 4.2 K before annealing (curve 1) and after annealing at 400° C. for 1 hour. Inset: $I_c(H)$ dependence of the same junction before annealing.

In contrast, an SIS, Nb/Zr-based junction with a multiply oxidized barrier is shown schematically in a cross-sectional view of the junction structure in FIG. 1b. Since the polycrystalline nature of the Zr overlayer reduces the quality of the barrier, one way to favor an amorphous structure may be to multiply deposit and subsequently oxidize very thin Zr overlayers. In one embodiment of the present invention, Nb/Zr/$ZrO_x$/Zr/$ZrO_x$/Zr/$ZrO_x$/Zr/Nb junctions were fabricated, where the thickness of the Zr layers was nominally 0.17 nm; each layer was oxidized at the rate of about 200 Pa s. As a result, junctions were made whose characteristics (at 4.2 K) are shown in FIG. 3, curve 1. The junctions displayed reasonably good on-chip reproducibility: at 4.4 K, seven junctions had $I_c$ values between 355 and 390 µA. The $I_c(H)$ dependence (shown in the inset of FIG. 3 for one of the junctions) is characteristic of a high-quality Josephson junction. After measurement, the chip was annealed for 1 hour at 400° C. As a result, the resistance of the junctions increased by a factor of about five (constant for all the junctions). Curve 2 in FIG. 3 shows CVC of the same junction (cf. curve 1) at 4.2 K after annealing. The increase in resistance may be explained by turning the $ZrO_x$ oxide into a more stoichiometric film of $ZrO_2$. The described technique of multiple oxidation may be used for many applications including being utilized to optimize junctions properties for MRAM (Magnetic Random-Access Memory), Superconducting RSFQ (Rapid Single-Flux Quantum) Electronics and superconducting electronics applications.

One particular application is that a multilayer structure of the present invention is utilized in a two qubit gate that is further disclosed below.

Example Two

The present invention, in another aspect, discloses a multi-terminal double barrier SISIS junction (S and I denote a superconductor and an insulating barrier respectively) utilized as a two-qubit gate with tunable intrinsic coupling. Two quantum wells are formed in vicinities of the left and right SIS subjunctions. This gives two individual qubits, which are intrinsically coupled via the middle S layer due to phase coherence. The inter-qubit coupling J is tuned by two bias supercurrents $I_1$ and $I_2$ across each of the SIS subjunctions independently. Additional coupling is accomplished by transport supercurrents $I_1^{tr}$ along adjacent S layers. Using a microscopic model, major qubit characteristics and sources of the intrinsic decoherence are studied. The entanglement of the two qubit states, leakage and fidelity characteristics versus J, are calculated and the readout process is discussed.

Among other things, the two-qubit gate of the present invention has several advantages as compared to formerly known designs. First, the device exploits intrinsic quantum mechanical coupling of two SIS qubits across their common S layer. This insures a better coherence during the quantum logic operations. Second, the coupling is well controlled with the bias Josephson across the SIS subjunctions and the tangential supercurrents flowing along adjacent superconducting layers. Third, the stacking of more subjunctions allows an effective readout and coupling to other qubits in the same sequence.

The two qubit SISIS gate operates by applying supercurrents across the SIS subjunctions (which are individual phase qubits) and by tangent supercurrents along the superconducting layers. one novel element is the terminal attached to the middle S layer, which is achieved with a lithographic technology. This allows addressing not only the SIS subjunctions during the quantum operations but also the proximity coupling between them.

Indeed, a tunable interaction between different types of Josephson qubits has been examined theoretically [26-28]. The device considered there [26-28] consisted of two current-biased Josephson junctions coupled via a capacitance, which allows one to perform arbitrary two-qubit quantum logic operations.

The method of capacitive coupling has, however, certain disadvantages. In particular, additional circuit elements and wiring serve as potential sources of disturbance in the system: the electric charges, accumulated on the capacitors, disturb the quantum states and cause errors during quantum logic operations. An alternative way to introduce a tunable coupling between different quantum subsystems is exploiting of a bias-tuned intrinsic coupling taking place in multilayered multiterminal structures [29,30]. Though general properties of the intrinsic entanglement in a solid state device were considered earlier [31], its implementation to the two-qubit gates is still in its infancy.

In this Section it is concentrated on a simple yet novel two-qubit gate based upon intrinsic properties of a double-barrier multi-terminal SISIS junction (S is the superconductor, I is the insulating barrier) with a proximity-type coupling between the left and right SIS subjunctions (see FIG. 4) across their common S layer. Elementary quantum logic operations on qubits [17-23, 25-27] are associated with controlled manipulations involving the two states $|0\rangle$ and $|1\rangle$ of the same qubit, the superposition of which forms a mixed state $|\psi\rangle$. Quantum computing also presumes a superposition $|\Phi_{1,2}\rangle$ of the states $|\psi\rangle$ and $|\psi\rangle$ associated with two different qubits, 1 and 2. An ideal two-qubit Hamiltonian in spin-½ notations takes the form [32]

$$\hat{H}_q = \sum_{k=1,2} [\varepsilon^{(k)}\hat{\sigma}_z^k + \tau^{(k)}\hat{\sigma}_x^k + \hat{\alpha}_k] + \sum_{nm} J_{nm}(i\hat{\sigma}_n^1) \otimes (i\hat{\sigma}_m^2) \quad (9.1)$$

where $\varepsilon^{(\kappa)}$ and $\sigma_z^\kappa$ are the energy level spacing and the inter-level tunneling matrix element in the k-th qubit, $\sigma_n^1$ and $\sigma_m^2$, are Pauli matrices associated with the 1$^{st}$ and 2$^{nd}$ qubit; $J_{nm}$ is the inter-qubit coupling energy, n, m being coordinate indices (x, y, z). Each of the qubits is independently controlled by fields $\hat{\alpha}_k = \alpha_k \exp(\hat{\sigma}_y^k \theta_k(t))$, where $\varepsilon^{(\kappa)}$ and $\sigma_z^\kappa$ are control field amplitudes and phases, and k=1, 2. For controlled manipulations of the qubit the coefficients of the Hamiltonian are modified by adiabatic changes of the Josephson supercurrents. The adiabaticity is required to eliminate transitions between different two-qubit gate states. The parameters of Eq. (9.1) also depend on particular design of the qubit gate and will be discussed in more detail in below. Each of the qubits in the two-qubit gate described by Eq. (9.1) should behave individually. One assumes that a.c. control pulses address both qubits with no disturbance of other circuit elements. The two qubits labeled as 1 and 2 are built using the tilted washboard Josephson energy potentials $U_1(\theta_1)$ and $U_2(\theta_2)$ where $\theta_1$ and $\theta_2$ are the phase differences across the left (1) and right (2) SIS sub-junctions. The sets of quantized energy levels, QL, positioned at $\epsilon_n^l$ (where l is the qubit index and n is the level quantum number) are formed in the washboard quantum wells $U_1$ and $U_2$. The tilting of $U_1$ and $U_2$ is controlled by the bias supercurrents $I_1$ and $I_2$ as shown in the lower part of FIG. 4. It will be seen that directions and magnitudes of $I_1$ and $I_2$ not only affect the inter-level spacing $\epsilon_n^l$ (l=1, 2)) in both the qubits but actually determine the strength of the inter-qubit interaction $J_{nm}$. In this way one accomplishes arbitrary single- and two-qubit quantum logic operations by applying appropriate a.c. and d.c. bias currents to the SIS sub-junctions.

This part of disclosure is organized as follows. In next subsection, it is computed the proximity coupling between the two SIS sub-junctions across their common interstitial S layer versus partial phase differences $\theta_1$ and $\theta_2$. In the subsection that follows, it is considered the inter-qubit coupling energy $J_{max}$ versus the middle S layer thickness d and the elastic electron mean free path $l_i$. In next subsection after that, it is determined how the inter-qubit coupling is controlled by the bias supercurrents $I_1$ and $I_2$ across the SIS sub-junctions. There is also a discussion of various parameters of the two-qubit gate Hamiltonian (9.1) for the setup. In next subsection afterward, it is examined the effect of transport supercurrents $I_l^{tr}$ along adjacent layers in each sub-junction on the two-qubit gate. In a following subsection after that, it is studied intrinsic sources of errors in the novel two-qubit gate and the leakage and fidelity are calculated. The dissipation introduced by the readout process is also discussed.

Proximity Coupling in a Multilayered Junction

Figure 5:
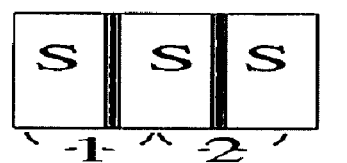
FIG. 5. (a) The two subjunctions of the SISIS junction. (b) Two SIS junctions coupled capacitively. The dashed line with a cross indicates that the coupling is not phase coherent. (c) The current-phase relationship in the two-barrier multiterminal junction.
Figure 5:
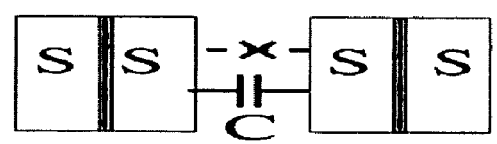
Figure 5:
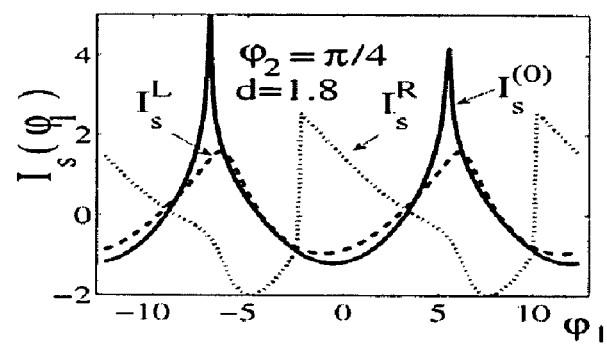
Figure 6:
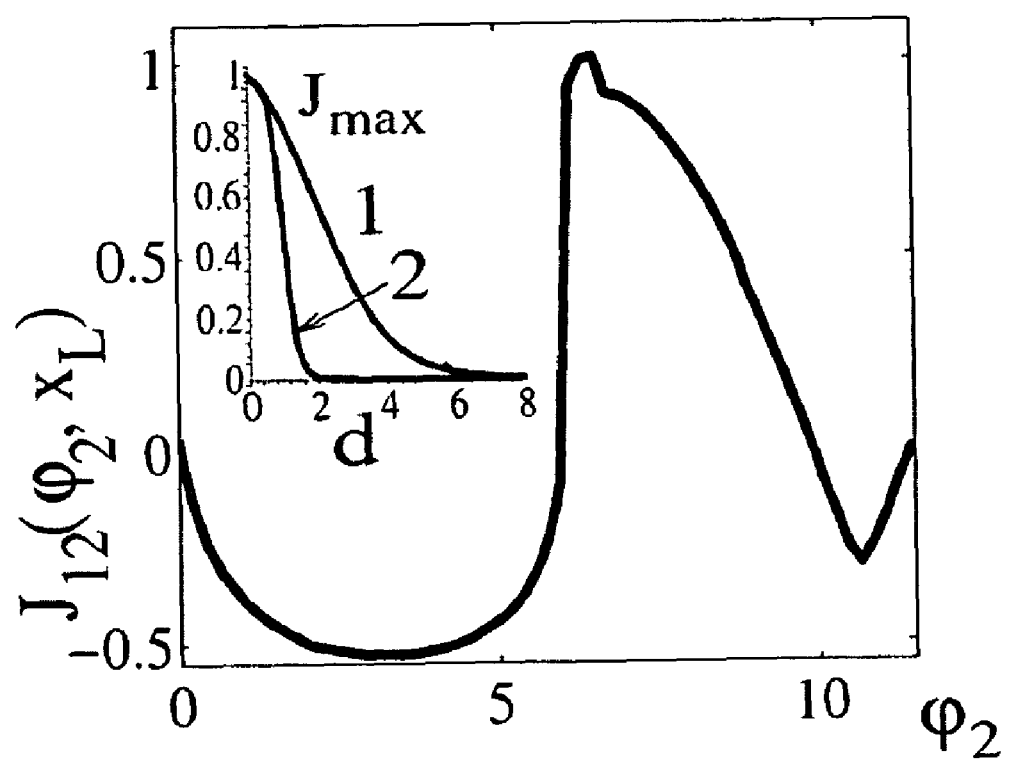
FIG. 6. The QC coupling energy of the left SIS subjunction. The inset shows the maximum coupling strength Jmax versus the thickness of the middle layer for "clean" (curve 1) and "dirty" limits (curve 2).

The coupling between the left and right SIS sub-junctions of the SISIS junction (see FIGS. 4 and 5(*a*)) is conveniently described in terms of Andreev reflection. Here it is interested in a non-local process in which an incoming electron and the reflected hole belong to different electrodes spatially separated by a distance D·l, where l being the superconducting coherence length. Though the two electrodes are separated, they couple via the superfluid condensate. Following Refs. [29,34] this process is referred to as a non-local Andreev reflection (NA). The NA process is actually equivalent to injecting of two spin-entangled electrons, which form a singlet state of a Cooper pair spread between two different leads [34]. The NA was studied experimentally in Ref. [29] using a double-barrier three-terminal NISIN junction. Similar double-barrier three-terminal SINIS devices were recently examined also in Ref. [35]. The quantized oscillation spectrum of a highly transparent SISIS junction was studied in Ref. [30]. The coherent interaction through the double-barrier junction is present even if the barrier transparency is relatively low (i.e., D≈10$^{-5}$, as in the NISIN structures used in Ref. [29]). Then, quantum coherence (QC) established across the whole SISIS junction yields a finite coupling between the right and the left SIS subjunctions via their common middle S layer.

The QC coupling energy $J_{12}$ between the two subjunctions 1 and 2 (see FIG. 5a) is defined as $$J_{12}(\varphi_2) = \max_{\varphi_1}\{W - W^{(0)}\}, \quad (9.2)$$

where $$W(\varphi) = \int^\varphi I_S^{SISIS}(\varphi')d\varphi' \quad (9.3)$$

is the energy of the whole SISIS junction. The energy of two single SIS junctions connected in series (see FIG. 5b) is $$W^{(0)}(\phi)=2\int^\phi I_s^{SIS}(\phi')d\phi'. \quad (9.4)$$

The two energies W and $W^{(0)}$ are not equal to each other because the current across the middle electrode of SISIS junction is evidently a phase-coherent supercurrent, while the electric current between two single SIS junctions connected in series (as shown by the dash line with a cross in FIG. 5b) is not phase-coherent. This difference between W and $W^{(0)}$ coming from the phase coherence in SISIS is a source of inter-subjunction coupling. The QC coupling between the left and right SIS subjunctions may be tuned by attaching a third terminal to the common S layer. Then the phase differences $\phi_1$ and $\phi_2$ across the left and right barriers of the SISIS junction can be controlled independently of each other and the quantum states of each subjunction is individually addressable. Though a microscopic calculation of J may be performed in various ways, here we utilize a quasiclassical Green function method with special boundary conditions at the interface barriers [38-40]. This approach allows a direct microscopic determination of the inter-junction coupling and is applicable to junctions with arbitrary interface transparency and electrode purity.

The QC coupling is tuned by the bias supercurrents $I_1$ and $I_2$. The bias is applied to each of the SIS subjunctions individually, as shown in FIG. 4. If $I_1 \neq I_2$, then the corresponding phase differences $\phi_1$ and $\phi_2$ are not equal to each other (i.e., $\phi_1 \neq \phi_2$), while the net supercurrent $I_s(\phi_1, \phi_2, x)$ inside the middle S layer of the SISIS junction depends also on the coordinate x in the direction perpendicular to interfaces.

The approach [37-40] gives a tractable microscopic description of the bias-controlled QC effect in multilayered superconducting junctions. The basic elementary process responsible for the coherent coupling in the system is the Andreev reflection. In the terms of Refs. [37-40], a moving hole creates a new electron with a reversed trajectory of motion. Most important is that the multiple processes of the electron-hole conversion keep the packet on a classical trajectory in the r-p space. The particles may switch to another classical trajectory at so-called knots, where the scattering occurs with a certain probability described by special boundary conditions [38,39]. The quasiclassical approximation has proven to be effective when studying the phase coherent transport in multilayered superconducting structures [36,40]. The non-uniform supercurrent $I_s(\phi_1, \phi_2, x)$ is obtained from the one-point quasiclassical Green function $\hat{g}$ as $$I_S(\varphi_1, \varphi_2, x) = \frac{\pi e \hbar p_F}{2m} v_0 \int d\varepsilon \int_{-1}^1 \eta d\eta Tr\{Im \hat{g}(\varepsilon, \eta, \varphi_1, \varphi_2, x)\} \quad (9.5)$$

where $\eta = \cos\Theta$, $\Theta$ being the electron incidence angle, $p_F$ is the Fermi momentum, and $v_o$ is the normal electron density of states at the Fermi level. The Green function $\hat{g}$ in Eq. (9.5) is expressed as $$\hat{g}(x)=(\overline{\psi}_-(x)\psi_+(x))^{-1}(\psi_+(x)\overline{\psi}_-(x)+\psi_-(x)\overline{\psi}_+(x)) \quad (9.6)$$

where spinors $\psi_\pm(x)$ are $$\overline{\psi}=-i\psi^T\hat{\sigma}_y=(v-u), \quad (9.7)$$

and T denotes transpose. The electron and hole envelope wavefunctions u and v are defined on classical trajectories. The trajectories are coupled to each other at the knots, associated with the interface barriers. The non-uniform supercurrent of Eq. (9.5) is used to control the coupling between the two SIS subjunctions, as will be discussed in the next Subsection.

Inter-qubit Coupling Energy

The inter-qubit coupling energy $J_{12}$ is computed using Eqs. (9.5), (9.6). The microscopic equations (9.5), (9.6) describe the properties of junctions with arbitrary transparency; they account for the tunneling across the interface barriers I and include the effect of elastic electron impurity scattering, and inelastic phonon scattering in the junction's electrodes. As a first step toward the computing $J_{12}$ we solve the quasiclassical Andreev equation $$\hat{H}\psi = E\psi \quad (9.8)$$

for $\psi_+(x)$ and $\psi_-(x)$ subject to special boundary conditions at the interface barrier positions $x=x_{L(R)}$, and at $x=\pm\infty$ for the geometry of FIG. 4. The solution inserted into Eq. (9.6) for the quasiclassical retarded Green function, $\hat{g}(x)$. Substituting $\hat{g}(x)$ into Eq. (9.6) one computes the total supercurrent $I_s(\phi_1, \phi_2, x)$. The local current-phase relationships obtained for $I_s$ inside the middle layer of the SISIS junction are shown in FIG. 5c where $I_s$ is denoted as $I_s^L(\phi_1)$ for fixed $\phi_2=\pi/4$ at the left barrier $x=x_L$, as $I_s^{(0)}(\phi_1)$ at the middle of the junction $x=0$, and as $I_s^R(\phi_1)$ at the right barrier $x=x_R$. Here we assume that $\phi'_{1,2}=\phi_{1,2}$. The local supercurrent $I_s(x)$ depends on the differences between $\phi_1$ and $\phi_2$; therefore, one may define the critical supercurrent in terms of one variable (e.g., $\phi_1$), and consider the behavior with respect to the second variable (i.e., $\phi_2$). This behavior is interpreted as the QC coupling between the two SIS subjunctions of a symmetric SISIS junction characterized by energy $J(\phi_1, \phi_2)$. The coupling energy of the left SIS subjunction, which also depends on the phase difference across the right SIS subjunction $\phi_2$, is obtained from Eq. (9.2). In Eq. (9.2)

$$W(\varphi_1, \varphi_2) = \frac{\Phi_0}{2\pi}I_c - \frac{1}{2}W_1(\varphi_1, \varphi_2) - \frac{1}{2}W_2(\varphi_1, \varphi_2), \quad (9.9)$$

is the SISIS "washboard" Josephson energy. In Eq. (9.3), $I_c$ is the absolute (i.e., in respect to both $\phi_1$ and $\phi_2$) critical current of the SISIS junction while the Josephson energy of the coupled SIS subjunction 1(2) is defined as $$W_{1(2)}(\varphi_1, \varphi_2) = \frac{\Phi_0}{2\pi}\int_{-\infty}^{\varphi_{1(2)}} I_S(\varphi_1, \varphi_2, x_L)d\varphi_{1(2)} \quad (9.10)$$

Eq. (9.2) together with Eqs. (9.5), (9.6), (9.3), and (9.4) constitute the QC coupling $J_{12}(\phi_2)$ of the left SIS subjunction to the right SIS subjunction as a function of $\phi_1$ and $\phi_2$, as determined by corresponding bias supercurrents $I_1$ and $I_2$ (here it is assumed that $\phi'_1=\phi_1$ and $\phi'_2=\phi_2$). It is emphasized that the coupling $J_{12}$ comes entirely from the phase coherence between the two SIS subjunctions.

Figure 9:
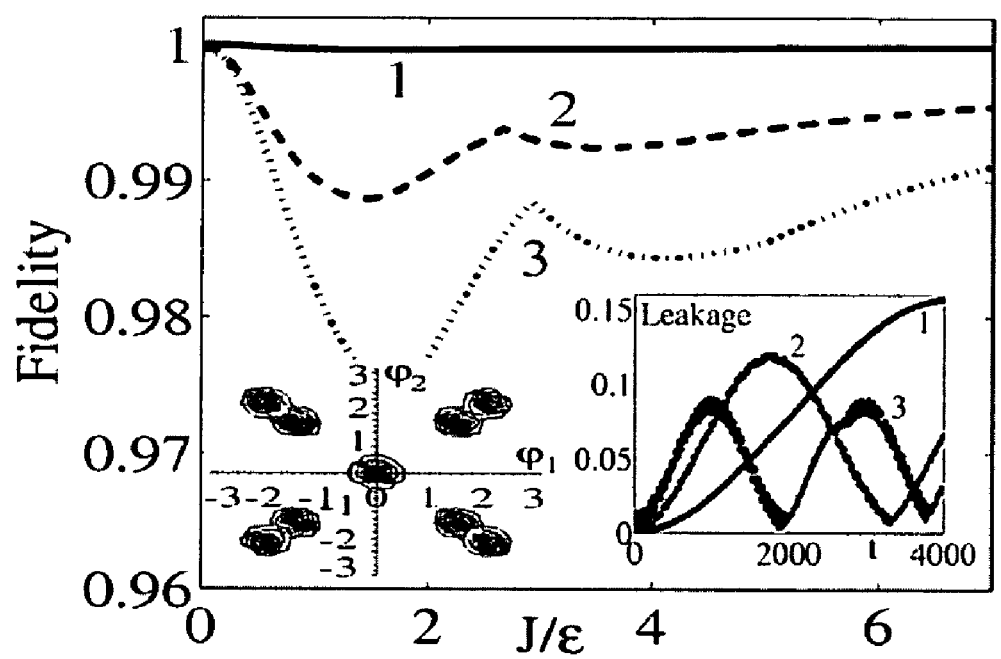
FIG. 9. Fidelity of the SISIS two-qubit gate for the three levels and different tunneling matrix elements τ=0.01, 0.6, and 0.9 for curves 1, 2, and 3, correspondingly. Dark spots in the left inset show regions of maximum entanglement. The right inset shows the related leakage probability curves versus time.

The computed dependence $J_{12}(\phi_2)$ at $x=x_L$ is plotted in FIG. 9.3, from which one can see that the sign and magnitude of $J_{12}(\phi_2)$ is controlled by the phase difference $\phi_2$ across the opposite SIS subjunction. The QC coupling magnitude $J(d)=\max_{\phi_2}\{J_{12}(\phi_2)\}$ (where d is the middle layer thickness in units of the BCS coherence length) is plotted in inset to FIG. 6, which shows how J depends on the thickness and purity of the middle layer, as characterized by the electron elastic mean free path $l_i$: if this layer is very thick ($d\gg\xi$), the mutual interaction of the subjunctions J vanishes. When the electron motion inside the middle layer is ballistic ($l_i\geq\xi$), the SIS subjunctions can interact though a relatively thick middle layer (curve 1 in to FIG. 6 for which $l_i=5\xi$). If, however, the middle layer is impure, the coupling range shortens: $\xi^*\approx\sqrt{\xi l_i}$, which is confirmed by our numerical calculations of J (see curve 2 in FIG. 6 computed for $l_i=0.3\xi$). This circumstance can be utilized to optimize the coupling in two-qubit gates.

Control of the Inter-qubit Coupling

In the setup shown in FIG. 4, the two SIS subjunctions are used as two coherently coupled qubits. The two-qubit idle state $|\Psi_{1,2}\rangle$ is realized when the strength $J_{12}$ of the inter-qubit coupling vanishes at some value of $\phi_2$. The manipulations of quantum states and the inter-qubit coupling are controlled by applying supercurrents between the S electrodes. An additional independent control is furnished when $\phi'_1\neq\phi_1$ and $\phi'_2\neq\phi_2$ (see FIG. 4) as will be discussed in next section. Here it is analyzed basic two qubit gate parameters (i.e., the level splitting $l$ and the inter-qubit coupling strength J) approximating the potential energy with simple analytical expressions. Properties of each individual SIS qubit, either 1 or 2, are conveniently described as a motion of a particle with the mass $C_{1(2)}$ in the "tilted washboard" potential $$U_{1(2)} = W_{1(2)} - \frac{\Phi_0}{2\pi} I_{1(2)} \varphi_{1(2)}. \tag{9.11}$$

The motion inside the quantum well leads to quantized states as sketched in the upper part of FIG. 4. The Josephson energy $W_{1(2)}$ of an SIS subjunction 1(2) entering Eq. (9.11) is given by Eq. (9.10). The subjunction 1(2) is coupled to its counterpart subjunction 2(1).

The quantum eigenstates and eigenvalues of the system in the potential $U_{1(2)}$ are obtained numerically for a given geometry of the double barrier junction. The input parameters for numerical computations include the capacitances $C_{1,2}$ of the left (right) SIS subjunctions, the S layer thickness $d_s$, the barrier transparency D, the junction area A, the energy gap $\Delta$, the elastic electron-impurity scattering rate $\gamma_i$, and the control supercurrents $I_{1,2}$. The inter-level spacing $\epsilon^{(l)}=\epsilon_1^{(l)}-\epsilon_2^{(l)}$ is tuned by altering $I_l$. Typically, one sets the J-E profiles to exploit just two levels in each quantum well, while the third level (used for the readout of the quantum state) is positioned just below the top of the well (see the upper part of FIG. 4), which is achieved in large area junctions when $I_c\Phi_0/2\pi\gg e^2/2C$ and $I_c-I_{1,2}\ll I_c$. In this approximation, the SISIS junction behaves like a non-relativistic two-body system. The behavior of the SISIS gate is then reduced to a trivial motion of the center of mass. The relative one-body motion is executed by a particle of mass $C=C_1C_2/(C_1+C_2)$ (where $C_1$ and $C_2$ are the capacitances of the left and right SIS subjunctions). The motion is described by a "coordinate" $\phi=\phi_1-\phi_2$ about a fixed center under the action of an "elastic force" $F_\phi=-\partial U(\phi)/\partial\phi$.

Figure 7:
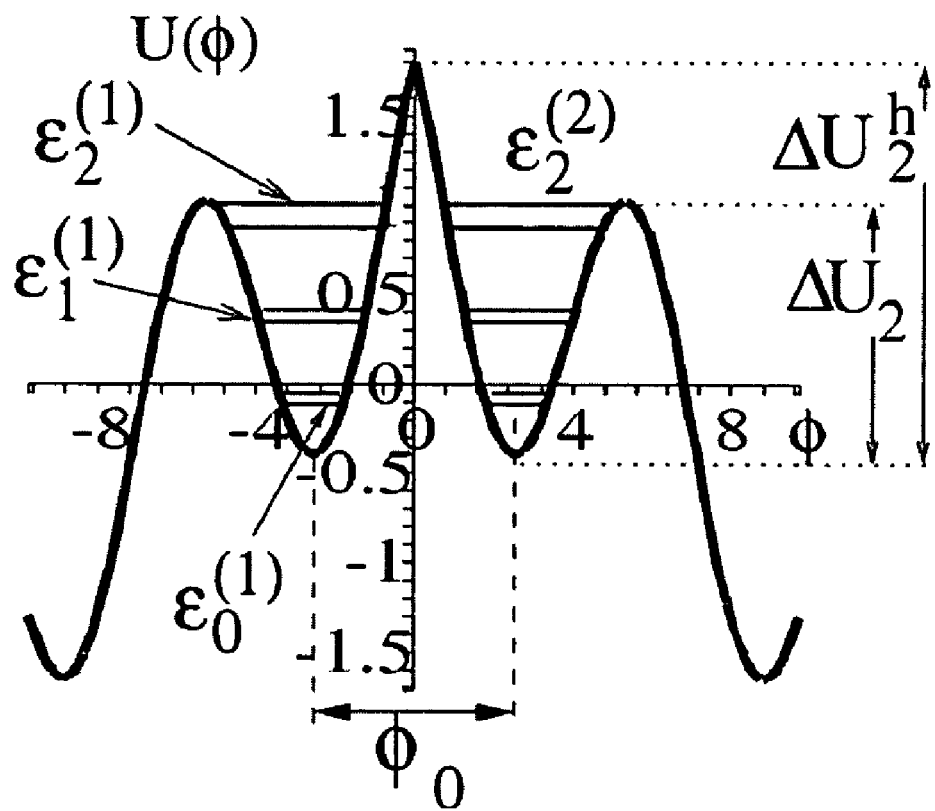
FIG. 7. A two-qubit gate potential with two wells separated by a hump, which is controlled by the bias supercurrents $I_1$ and $I_2$. The quantized levels $\epsilon_n(l)$ are formed in each of the wells, while the interlevel splitting $\epsilon_n$ is controlled by the hump height.
Figure 8:
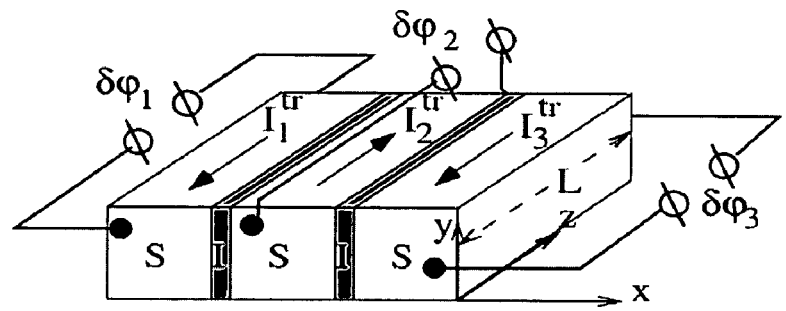
FIG. 8. (a) An additional control of the two-qubit states with transport supercurrents $I_{ptr}$ flowing in the adjacent S layers. (b) A nonuniform distribution of the supercurrent $j_s(z)$ versus the lateral coordinate z (in units of $10\lambda_J/L$) along adjacent S layers. (c) The Josephson energy potential.
Figure 8:
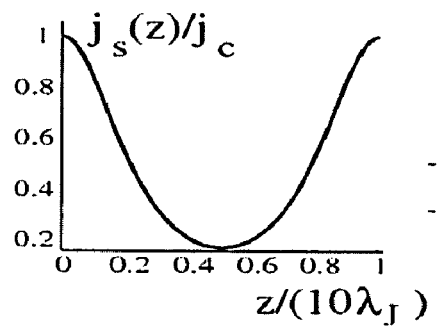
Figure 8:
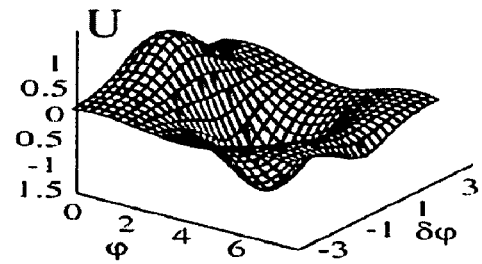

Here we are interested in a relative motion of the reduced "mass" C in the two-well model potential $U(\phi)$ shown in FIG. 7. Simple analytical formulas are obtained when the two-well $U(\phi)$ is further approximated by a function pieced together from two parabolas augmented by a qubit term. Each of these forms has a quadratic curvature at the bottom, which gives a classical oscillation frequency $$\omega_l = 2^{1/4}\sqrt{\frac{2\pi I_c}{\Phi_0 C}}\left(1-\frac{I_l}{I_c}\right)^{1/4}. \tag{9.12}$$

controlled by the supercurrent $I_l$.

The two characteristic barriers in the model potential $U(\phi)$ have the height $$\Delta U_l = 2\sqrt{2}\frac{I_c\Phi_0}{3\pi}\left(1-\frac{I_l}{I_c}\right)^{3/2} \tag{9.13}$$

where l is related to the left (l=1) and right (l=2) wells. The two wells are separated by a barrier, which in a symmetric case has the height $\Delta U^h = C\omega_p^2\phi_0^2/2$ where $\phi_0$ is the distance between the two wells (see FIG. 7).

Although the applicability of such an approximation is limited, it serves as a good illustration when modeling qubit switches. Generally speaking, the energy spacing $\epsilon^{(l)}=\epsilon_1^{(l)}-\epsilon_0^{(l)}$ and the tunneling matrix element $\tau$, which enter Hamiltonian (H), depend on the reduced phase difference $\phi$ in quite a complicated way. A finite inter-qubit coupling $J\neq 0$ causes an additional splitting of each level, i.e., $\epsilon_n^{(l)}\to\epsilon_n^{(l)\pm}$ (n=0 ... 3 and l=1, 2), so the relevant splitting magnitude is related to $\epsilon_n^{(l)+}-\epsilon_n^{(l)-}$. In the limit of a weak inter-qubit coupling, for a symmetric two-qubit gate, within our two-body motion model one finds [43]

$$\delta\epsilon_n^{(l)} = 2\hbar\omega_p(\sigma/2\pi)^{1/2}\exp(-\sigma) \tag{9.14}$$

and $$\delta\epsilon_n^{(2)} = 2\hbar\omega_p(\sigma/\pi)^{1/2}\exp(-\sigma), \tag{9.15}$$

where $\sigma=C\omega_p\phi_0^2/\hbar$, and the quantized level energies of a non-interacting qubit are $$\epsilon_1 = \epsilon_0 + \omega_p[1-(5/36)(\hbar\omega_p/\Delta U)] \tag{9.16}$$

and $$\beta_2 = \epsilon_1 + \omega_p[1-(11/36)(\hbar\omega_p/\Delta U)]. \tag{9.17}$$

In the above formulas it is omitted the qubit index l for brevity.

Additional Control Using Tangential Supercurrents

The two-qubit quantum state $|\Psi_{1,2}\rangle$ is controlled by two bias supercurrents $I_1$ and $I_2$ as shown in FIG. 4. By changing the magnitude and direction of both $I_1$ and $I_2$ one shifts the quantized level positions $\epsilon_n^{(l)}$ and their splitting $\delta\epsilon_n^{(l)}$. However the two parameters $I_1$ and $I_2$ are generally not enough for a full control of the two-qubit gate. In addition to the manipulating with each individual qubit one must tune the inter-qubit coupling as well. This requires at least three independent control parameters. An additional independent control over the two-qubit gate is accomplished by applying transport supercurrents $I_k^{tr}$ (k=1 ... 3) tangent to the S electrodes, as shown in FIG. 8a (see also FIG. 4). If the magnitudes of $\delta I_1^{tr}=I_1^{tr}-I_2^{tr}$ and $\delta I_2^{tr}=I_2^{tr}-I_3^{tr}$ are finite, the Josephson "washboard" energy U is modified, which in turn changes the two-qubit state $|\clubsuit\rangle_{1,2}$. When the SISIS junction in the lateral z-direction is sufficiently long, i.e., $L \geq \lambda_J$ (where $\lambda_J = \hbar c^2 / [8\pi e(2\lambda_L + d_B)j_c]$ is the Josephson penetration depth, $\lambda_L$ is the London penetration depth, $d_B$ is the thickness of the insulating barrier, and $j_c$ is the Josephson critical supercurrent density), the distribution of Josephson supercurrent $j_s(z)$ inside each of the SIS subjunctions becomes non-uniform [44] and depends also on the lateral coordinate z (see FIG. 8a). Such an inhomogeneous distribution of the supercurrent density $j_s$ across each of the SIS subjunctions causes a finite phase change $\delta\phi_1$ along the z-direction providing that $\delta\phi_1 = \phi'_1 - \phi_1 \neq 0$ and $\delta\phi_2 = \phi'_2 - \phi_2 \neq 0$ (see also FIG. 4).

This situation resembles the penetration of magnetic flux into a long Josephson junction. In the case here $\delta I_1^{tr}$ plays a role similar to the y-component of the external d.c. magnetic field $H_y$, which was the case in Ref. [44]. According to Ref. [44], the $j_s(z)$ profile depends on the ratio $L/\lambda_J$: the supercurrent density is highly inhomogeneous for large $L/\lambda_J$ when a magnetic flux enters the subjunction. The actual $j_s(z)$ dependence versus $\delta I_1^{tr}$ is obtained from the sine-Gordon equation $$\frac{\partial^2 \varphi_l}{\partial z^2} = \frac{1}{\lambda_J} \sin\varphi_l \quad (9.18)$$

together with by the boundary conditions $(\partial\phi_1/\partial z)|_{z=0} = 0$ and $(\partial\phi_1/\partial z)|_{z=L} = \delta I_1^{tr}/en_s = \zeta$, where $n_s$ is the superfluid charge carrier concentration [21]. In the BCS approximation one gets $$n_s = \pi n \Delta^2 T \Sigma_k (\pi^2 T^2 (2k+1)^2 + \Delta^2)^{-3/2} \quad (9.19)$$

here $n_s$ and n are the superfluid and normal charge carrier concentrations, T is the temperature, and $\Delta$ is the energy gap.

The solution $\phi_1(z)$ of Eq. (9.18) is given in elliptic functions [33]. In FIG. 8b it is shown a typical distribution of the supercurrent $j_s(z)/j_c$ along the left subjunction with $L/\lambda_J = 10$ and $\delta I_1^{tr} = 0$. In FIG. 8c it is ploted the Josephson energy profile $U_1(\phi_1, \delta\phi_1)$ in the left quantum well at fixed $I_2$ for a long junction with $L/\lambda_J = 10$. One can see that the $U_1$-profile depends on $\delta\phi_1$ (which actually is $\propto \delta I_1^{tr}$). The transport supercurrents $I_{1,2}^{tr}$ renormalize the height of the characteristic barriers $\Delta U_{1,2}(\phi)$ which acquire the dependence on $\zeta = \delta I_1^{tr}/en_s$. From Eq. (9.18) with $z \ll \lambda_J$ and $\zeta \ll I_c/en_s$ one finds $$\Delta U_{1,2}(\phi, \zeta) \approx \frac{\Delta U_{1,2}(\phi, \zeta = 0)}{Z(\phi, \zeta)} \quad (9.20)$$

where $\Delta U_{1,2}(\phi, \zeta = 0) = \Delta U_{1,2}(\phi)$ and the renormalizing function is $$\frac{1}{Z(\phi, \zeta)} = 1 + \left(\frac{l_\phi}{v_\phi} \zeta + \frac{1 - v_\phi}{2v_\phi} \zeta^2\right)\left(1 + \frac{z^2}{2\lambda_J}\right), \quad (9.21)$$

the remaining quantities are given by $v_\phi = \Delta U(\phi)/\Delta U_0$, $\Delta U_0 = \Delta U(\phi)|_{\phi=0}$, $l_\phi = \partial v_\phi/\partial \phi$. For a non-interacting junction $v_\phi = 1 - \cos\phi$, while for the subjunctions of the SISIS junction the expression for $v_\phi$ is more complicated and is obtained numerically for a given S layer thickness $d_s$, barrier transparency D, junction area A, energy gap $\Delta$, elastic electron-impurity scattering time $\tau_i$, and control supercurrents $I_{1,2}^{tr}$. When finite transport supercurrents $I_{1,2}^{tr} \neq 0$ are applied, the levels $\epsilon_{1,2}$ are shifted versus $\zeta$. The characteristic barriers $\Delta U_{1,2}$ [see Eq. (9.20)] entering Eqs. (9.16), (9.17) for $\epsilon_{1,2}$ are renormalized by $Z(\phi,\zeta)$ as follows from Eqs. (9.20), (9.21). In this way, Eqs. (9.20), (9.16), (9.17) in conjunction with Eqs. (9.13), (9.20) constitute the energy level dispersion versus the control transport supercurrents $I_{1,2}^{tr}$. The solution demonstrates that the two-qubit states $|\clubsuit\rangle_{1,2}$ are readily controlled by the transport supercurrents $I_{1,2}^{tr}$ in addition to the bias supercurrents $I_{1,2}$.

Leakage and Fidelity of the Two-qubit Gate

The intrinsic inter-qubit coupling in an SISIS gate is via weak Josephson supercurrents, for which the switching frequency is relatively low ($\omega \sim 10^6 - 10^9$ s$^{-1}$). The supercurrents produce no noise in the junction [45], thus the coupling is "quiet". Since there is no a.c. electric field in the SISIS junction, the disturbance to the surrounding circuit elements is negligible. Therefore, the current and charge noises are typically very low in the SISIS device. However, the supercurrent is generated by an external circuit and the qubit will be exposed to any associated noise. Additionally, dissipation in real SISIS gates is possible due to tunneling of a quantum state through the characteristic barriers $\Delta U_{1,2}(\phi)$ (see FIG. 7). Since the tunneling rate $\Gamma$ depends exponentially on the barrier height and width, the populated upper level $\epsilon_2$ may in principle contribute to the dissipation, especially if one biases the system such that the tunneling rate $\Gamma_2$ out of $|2\rangle$ is $$\Gamma_2 = (\epsilon_2 + \epsilon_0 - 2\epsilon_1)/2\pi. \quad (9.22)$$

The relevant tunneling probability is $$P_t^{(2)} = \int p_2 \Gamma_2 dt. \quad (9.23)$$

Although the magnitude of $P_t^{(2)}$ may be significant, the tunneling probabilities $P_t^{(0)}$ and $P_t^{(1)}$ out of states $|0\rangle$ and $|1\rangle$ are about $10^3$ and $10^6$ times lower as compared to $P_t^{(2)}$. The dissipation $W_2$ due to a transient population [46] $p_2$ of state $|2\rangle$ is estimated as $$W_2 = \int \epsilon_2 p_2 \Gamma_2 dt/\hbar \quad (9.24)$$

This formula implies that $W_2$ is roughly proportional to $p_2$ and to the time of measurement, $t_m$. The dissipation is eliminated by keeping the population $p_2$ of $\epsilon_2$ as small as possible, and $t_m$ as short as possible during the quantum logic operations [46].

However intrinsic sources of error are more important in an SISIS qubit gate. Such errors arise when the interaction is turned on ($J \neq 0$) and are caused by the quantum leakage. The leakage takes place if the Hilbert space of the real gate is larger than that of the qubit's computational subspace. A different time evolution in the real space and in the computational subspace causes an error in the gate operation. An ideal unitary gate operation $U_f(t)$ is obtained when turning on the inter-qubit coupling for a time $t_0$. By choosing $t_0$ one may accomplish an arbitrary gate operation [17,27].

The output of an operation is related to the input state via the map $\hat{\Pi} U_R(t) \hat{\Pi}$ where $U_R(t)$ is the unitary operator which acts on the full Hilbert space, and $\hat{\Pi}$ is the operator which projects the Hamiltonian on the computational subspace; this projection can be written as $\hat{\Pi} \hat{H} \hat{\Pi} = |0\rangle\langle 0| + |1\rangle\langle 1| \hat{H}$ $(|0\rangle\langle 0| + |1\rangle\langle 1|)$, where $|0\rangle\langle 0| = (\hat{1} - \hat{\sigma}_z)/2$, $|1\rangle\langle 1| = (\hat{1} + \hat{\sigma}_z)/2$, $|0\rangle\langle 1| = (\hat{\sigma}_x - i\hat{\sigma}_y)/2$, and $|1\rangle\langle 0| = (\hat{\sigma}_x + i\hat{\sigma}_y)/2$. The error of an operation is minimized by setting $\hat{\Pi} U_R(t) \hat{\Pi}$ as close as possible to $U_f(t_0)$. In general an optimal operation requires $t \neq t_0$ to as all the system eigenvalues are modified by states outside the computational subspace. According to Refs. [41,42], the fidelity and leakage probabilities are defined as $$F = 1 - \min_{\{t\}} \|U_I(t_0) - \Pi U_R(t)\Pi\|/2 \quad (9.25)$$

and $$L(t) = 1 - \min_{\psi} \langle \psi | U_R^\dagger(t) \Pi U_R(t) | \psi \rangle. \quad (9.26)$$

The norm $\|\ldots\|$ of an arbitrary operator K is defined as $$\|K\| = Sup_\psi |K\rangle| = Sup_\psi \sqrt{\langle \psi | K^\dagger K | \psi \rangle} \quad (9.27)$$

over the full set of vectors of the computational subspace. This definition implies that $\|K\|=\sqrt{\kappa_M}$, where $\kappa_M$ is the largest eigenvalue of K+K. The evolution operator is $$U_R(t) = \Sigma_n \exp(-i\epsilon_n t)|\Psi_n\rangle\langle\Psi_n| \quad (9.28)$$

(we here set $\hbar=1$). For a simple three-state analysis one uses that $$|0\rangle = \begin{pmatrix} 1 \\ 0 \\ 0 \end{pmatrix}; |1\rangle = \begin{pmatrix} 0 \\ 1 \\ 0 \end{pmatrix}; \quad (9.29)$$

the eigenfunctions of the Josephson potential energy of a non-interactive SIS junction at $I_{1,2}=0$ can be expressed in terms of Mathieu functions. Therefore, the evolution in the computational subspace for a time interval t is given by $$\hat{\Pi}U_R(t)\hat{\Pi} = \sum_n e^{-i\epsilon_n t}\hat{\Pi}|\Phi_n\rangle\langle\Phi_n|\hat{\Pi} \quad (9.30)$$

$$= \sum_n e^{-i\epsilon_n t}(|0\rangle\langle 0| + |1\rangle\langle 1|) \cdot$$

$$|\Phi_n\rangle\langle\Phi_n|(|0\rangle\langle 0| + |1\rangle\langle 1|).$$

The above Eqs. (9.25) allow modeling of the basic two-qubit characteristics and simulation of the two-qubit gate dynamics with qubit parameters computed earlier in this Sections. According to Eq. (9.30), basic parameters include the qubit energy level positions $\epsilon_{0,1,2}$, the inter-level tunneling matrix element r and the inter-qubit coupling energy $J_{nm}$. The dominant two-qubit gate characteristics, which are determined by the inter-qubit coupling and readout, can be studied within a 3×3 state analysis. In that case one works with a 6-dimensional Hilbert space of the real gate, involving the 3 states $|0\rangle_n$, $|1\rangle_n$, and $|2\rangle_n$, for each of the qubits n=1, 2 affected by the interaction J. The computation is done in a straightforward way, using computer algebra and numerical methods. In this way one begins with a microscopic computation of all the two-qubit parameters for a given SISIS geometry, electrode purity and temperature. The next stage involves a study of the inter-qubit interaction J and coupling to external read-out meters. Finally one includes the dominant dissipative and dynamic properties of the two-qubit gates, i.e., the leakage and fidelity described by the Hamiltonian (9.1).

An illustrative insight into the two-qubit dynamics and dissipative characteristics is given by analytical formulas given earlier in this Section. Analytical solutions were given in an earlier section [see Eqs. (9.14)-(9.17)] for a three-state single qubit gate and a 2×2-state two-qubit gate. As an example one may obtain an analytical expression for a resonant contribution to the leakage of a three-state system. The three-state system is described by the Hamiltonian $$H^{3s} = \begin{pmatrix} -\varepsilon & \gamma & 0 \\ \delta & \varepsilon & \sqrt{2}\gamma \\ 0 & \sqrt{2}\delta & \varepsilon+\eta \end{pmatrix} \rightarrow \begin{pmatrix} E_0 & 0 & 0 \\ 0 & E_1 & 0 \\ 0 & 0 & E_2 \end{pmatrix} \quad (9.31)$$

where $-\epsilon$ is the position of the lowest level, and $\delta$ and $\gamma$ denote the matrix elements of inter-level tunneling with the external field factors included. The arrow in Eq. (9.31) indicates the diagonalization of $H^{3s}$. The eigenvectors of (9.31) are $$|\Phi_0\rangle = \frac{1}{\sqrt{N}}\begin{pmatrix} \Theta_0 \\ \delta C_0 \\ \sqrt{2}\delta^2 \end{pmatrix}; |\Phi_1\rangle = \frac{1}{\sqrt{N}}\begin{pmatrix} \Theta_1 \\ \delta C_1 \\ \sqrt{2}\delta^2 \end{pmatrix} \quad (9.32)$$

$$|\Phi_2\rangle = \frac{1}{\sqrt{N}}\begin{pmatrix} \Theta_2 \\ \delta C_2 \\ \sqrt{2}\delta^2 \end{pmatrix}$$

where $C_0=P_- - 2(\epsilon+\eta)/3$, $C_{1,2}=C_\pm = (-P_- \mp i\sqrt{3}P_+)/2 - 2(\epsilon+\eta)/3$, $P_\pm = (B_0^2 \mp 4\epsilon^2 + 2\epsilon\eta + \eta^2)/(3B_0)$, $B_0 = (3\epsilon\eta^2 + \eta^3 + 3B_1 - 8\epsilon^3 - 6\epsilon^2\eta)^{1/3}$, and $B_1 = i(12\epsilon^4\eta^2 + 3\epsilon^2\eta^4 + 12\epsilon^3\eta^3)^{1/2}$. The above Eqs. (9.31), (9.32) allow a direct computing of the resonant contribution to the leakage at the frequency of external field $\omega=(\epsilon_1-\epsilon_0)/\hbar$ for which one obtains $$\overline{L(t)}'=1-(\Theta_0^4+\Theta_1^4+\Theta_2^4+\Theta_0^2\Theta_1^2+\Xi^4)/N^4; \quad (9.33)$$

here $\Xi^4=|\gamma|\Theta_0\Theta_1(\Theta_0 C_1+\Theta_1 C_0)$ and the normalizing factor is $$N^4=\Theta_0^4+\Theta_1^4+\Theta_2^4+2\Theta_0^2\Theta_1^2+2\Theta_1^2\Theta_2^2+2\Theta_0^2\Theta_2^2 \quad (9.34)$$

where $\Theta_{0,1,2}=\Theta(E_{0,1,2})$, and the auxiliary function $\Theta(\zeta)$ is $$\Theta(\zeta)=(\zeta-\epsilon)(\epsilon-\zeta-\eta). \quad (9.35)$$

The eigenenergies of the Hamiltonian (9.31) are obtained as $$E_0 = P_+ + (\epsilon+\eta)/3$$

$$E_{1,2} = E_\pm = -P_-/2 + (\epsilon+\eta)/3 \mp i\sqrt{3}P_+/2. \quad (9.36)$$

The corresponding analytical expression for the fidelity is much more cumbersome.

Typical results for the fidelity and leakage probability versus time t are shown in FIG. 9. One can see that the fidelity of the SISIS gate shows anomalies when the inter-qubit coupling is sufficiently large, i.e., when it exceeds the splitting energy, $J/\epsilon>1$. If the coupling is small, the qubit gate fidelity is close to 1. The leakage probability versus the evolution time t oscillates with a large period which depends on the qubit parameters and the inter-qubit coupling, though it is small for $t \leq 10^3$. Optimal working regions are associated with avoided level crossing [17,26] where one achieves the maximum entanglement between the quantum states of the two SIS subjunctions. The entanglement is computed using Schmidt decomposition [47,48], which represents any entangled state by a biorthogonal expression with positive real coefficients $$\hat{\Psi}(1,2) = \sum_{i=1} c_i |\alpha_i\rangle \otimes |\beta_i\rangle \quad (9.37)$$

where $|\alpha_i\rangle$ and $|\beta_i\rangle$ are orthonormal states of subjunctions 1 and 2 and $c_i$ are real and positive. The entanglement of the state (9.37) [47,48] is $$E = -\sum_i c_i^2 \log_2 c_i^2. \quad (9.38)$$

Since the inter-level spacing $\epsilon$, tunneling amplitude $\tau$, and the inter-qubit coupling J depend on the bias current $I_1$, the entanglement is computed self-consistently. Typical results for entanglement are shown in the contour plot (see the left inset in FIG. 9), where it is assumed the junction transparency $D=10^{-4}$, $d=3$, and $1/\xi=5$. Dark spots in the $\{\phi_1,\phi_2\}$-plane correspond to the avoided level crossing (working) regions having maximum inter-qubit entanglement.

The same QC coupling mechanism may be used for a controlled readout of the two-qubit state. Since the measurement is executed with weak supercurrents, there is no direct energy dissipation in the multibarrier Josephson junction. Instead the dissipation occurs rather indirectly via the tunneling through the characteristic barriers, as was mentioned at the beginning of this Subsection. Quantum measurement of the qubit states [49] is furnished in a six-barrier multi-terminal SISI-SISIS-ISIS junction, where the two additional SISI subjunctions act as quantum meters. The SISI- and -ISIS sections measure the left and right side SIS subjunctions of the SISIS junction via the QC coupling. During the quantum measurement event the quantum states of SISI- and -ISIS sections are entangled with the adjacent SIS subjunction for a short time $t_m \ll t_{dc}$ ($t_{dc}$ is the decoherence time). To insure a sufficient sensitivity of the measurement, one biases the measured SIS subjunction such that the upper level $\tilde{\epsilon}_2$ is located at the top of the characteristic barrier $\Delta U_{1,2}$. The readout of the two-qubit states $|\Phi_{1,2}\rangle$ is conducted by applying short pulses of a.c. supercurrent $I_{1,2}^{ac}(t)$ to the SIS subjunctions. The $\epsilon_2$ level becomes populated with probability $p_2(t)$. The system then tunnels out from the populated state $|2\rangle$ with the tunneling rate $\Gamma_2$. To evaluate the energy dissipation $W_2$, we establish the time dependence of the upper level population $p_2(t)$. This is done by introducing of a fourth fictional auxiliary state $|2\rangle_n$ (see, e.g., Ref. [46]). The tunneling from the state $|2\rangle_{1,2}$ to the auxiliary state $|3\rangle_n$ is described by the amplitude damping of fictitious qubits [Chuang] within the 4 ₄4-state analysis. The full space now includes 4 states for each of the qubits affected by the interaction J, which gives in total 8-dimensional Hilbert space of the real two-qubit gate. Computation of the qubit characteristics are conducted numerically. Initially one finds the parameters of the two-qubit Hamiltonian (9.31) as described in this Section earlier. The tunneling dynamics is then modeled by using the operator-sum representation where an initial density matrix $\hat{\rho}_i$ is mapped to the final density matrix $\hat{\rho}_f$ as $$\hat{\rho}_f = \sum_m \hat{E}_m \hat{\rho}_i \hat{E}_m^\dagger \quad (9.39)$$

where $\hat{E}_m$ are the Kraus operators [46]. The numerical analysis is performed by dividing the time dependence $\hat{E}_m(t)$ into many discrete steps as described in Ref. [46]. The input parameters include the junction parameters listed in an earlier section, together with the ac pulse amplitude and duration, from which one obtains the explicit form of the density matrix $\hat{\rho}_i$ before the tunneling event. Then $\hat{\rho}_i$ is mapped onto $\hat{\rho}_f$ in accordance with Eq. (9.39). Finally it is determined the time dependence $p_2(t)$, which gives the dissipation $W_2$ for each of the meters for given parameters of the six-barrier device. In general, the dissipation introduced by a meter depends on the measurement time $t_m$ and the sensitivity of the meter. The sensitivity actually determines a minimal threshold magnitude of the energy dissipation $W_2$, which must be sufficient for a reliable readout. For a two-qubit gate with parameters used in FIG. 9 and J=0.2, a most effective readout is achieved when $\ln(t_{dc}/t_m) \approx 10$ and $I_0^{ac}/I_c \approx 10^{-2}$ where $t_{dc}$ is the decoherence time and $I_0^{ac}$ is the amplitude of the a.c. supercurrent pulse used to excite $\epsilon_2$ during the readout.

In sum, the intrinsic coupling of the proposed multilayer devices assures a low decoherence and dephasing of the resulting two-qubit gate. If the measurement time $t_m$ is sufficiently short while the tunneling current from the upper state through the characteristic barrier is small, the decoherence and dephasing are caused by the leakage only. The leakage comes from the induced changes in the Hilbert space of the real gate as considered above. This makes the intrinsic coupling mechanism attractive for implementing in two-qubit gates.

The suggested model quantitatively describes general properties of the two-qubit gate with an externally controlled coupling. Since the coupling is intrinsic and coherent, it allows eliminating of additional circuit elements and wiring. The QC coupling is tuned by the biasing Josephson supercurrents which typically are much smaller than currents circulating in flux qubits. No charge accumulates on the coupling element in contrast to the case of the two-qubit gates with a capacitive coupling. In this way internal and external sources of decoherence in the system can be minimized. Nevertheless one should pay attention to the remaining intrinsic sources of the decoherence, which act during the two-qubit quantum logic operations.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

LIST OF REFERENCES

[1] J. Geerk, U. Kaufmann, W. Bangert, and H. Rietschel, Phys. Rev. B 33 1621 (1986).

[2] S. Morohashi, Y. Kataoka, T. Yagishita, and S. Hasuo, Appl. Phys. Lett. 63 1570 (1993).

[3] S. Morohashi and S. Hasuo, Appt. Phys. Lett. 63 2285 (1993).

[4] J. Wang, P. P. Freitas, and E. Snoeck, Appl. Phys. Lett. 79 4553 (2001); J. Wang, P. P. Freitas, E. Snoeck, P. Wei and J. C. Soares, Appl. Phys. Lett. 79 4387 (2001).

[5] J. Wang, P. P. Freitas, E. Snoeck, X. Battle, and J. Cuadra, Appl. Phys. Lett. 91 7463 (2002).

[6] C.-M. Choi and S.-R. Lee, Phys. Stat. Sol. (a) 201 1704 (2004).

[7] C.-M. Choi and S.-R. Lee, IEEE Trans. Magn., 40 2281 (2004).

[8] N. Franco, I. V. Yavorovskiy, A. Fonseca, J. A. A. Gouveia, C. Marques, E. Alves, R. A. Ferreira, P. P. Freitas, N. P. Barradas, Nuclear Instruments and Methods in Physics Research B 240 365 (2005).

[9] D. Lee, H. Choi, H. Sim, D. Choi, H. Hwang, M.-J. Lee, S.-A. Seo, and I. K. Yoo, IEEE Electron Device Lett., 26 719 (2005).

[10] J. J. Yang, Y. Yang, K. Wu, and Y. A. Chang, J. Appl. Phys. 98, 074508 (2005).

[11] I. P. Nevirkovets, O. Chernyashevskyy, and J. B. Ketterson, Appl. Phys. Lett. 88, 212504 (2006).

[12] J. M. Murduck, J. Porter, W. Dozier, R. Sandell, J. Burch, J. Bulman, C. Dang, L. Lee, H. Chan, R. W. Simon, and A. H. Silver, IEEE Trans. Magn. 25 1139 (1989).

[13] E. P. Houwman, D. Veldhuis, J. Flokstra, and H. Rogalla, J. Appl. Phys. 67, 1993 (1990).

[14] P. K. Wong, J. E. Evetts, and M. G. Blamire, J. Appl. Phys. 83, 6697 (1998).

[15] D. Ozkaya, R. E. Dunin-Borkowski, and A. K. Petford-Long, P. K. Wong and M. G. Blamire, J. Appl. Phys. 87, 5200 (2000).

[16] S. Mitani, K. Tsukamoto, T. Seki, T. Shima, and K. Takanashi, IEEE Trans. Magn. 41 2606 (2005).

[17] A. J. Berkley, H. Xu, R. C. Ramos, M. A. Gubrud, F. W. Strauch, P. R. Johnson, J. R. Anderson, A. J. Dragt, C. J. Lobb, and F. C. Wellstood, Science 300, 1548 (2003).

[18] Yu. A. Pashkin et al., Nature_London_421, 823 (2003).

[19] Y. Nakamura, Yu. A. Pashkin, and J. S. Tsai, Nature_London_398, 786 (1999).

[20] D. Vion, A. Aassime, A. Cottet, P. Joyez, H. Pothier, C. Urbina, D. Esteve, and M. H. Devoret, Science 296, 286 (2002).

[21] J. R. Friedman et al., Nature_London_406, 43 (2000).

[22] C. H. van der Wal et al., Science 290, 773 (2000).

[23] I. Chiorescu, Y. Nakamura, C. J. P. M. Harmans, and J. E. Mooij, Science 299, 1869 (2003).

[24] Y. Yu et al., Science 296, 889 (2002).

[25] J. M. Martinis, S, Nam, J. Aumentado, and C. Urbina, Phys. Rev. Lett. 89, 117901 (2002).

[26] A. Blais, A. Maassen van den Brink, and A. M. Zagoskin, Phys. Rev. Lett. 90, 127901 (2003).

[27] R. C. Ramos, M. A. Gubrud, A. J. Berkley, J. R. Anderson, C. J. Lobb, and F. C. Wellstood, IEEE Trans. Appl. Supercond. 11, 998 (2001); P. R. Johnson, F. W. Strauch, A. J. Dragt, R. C. Ramos, C. J. Lobb, J. R. Anderson, and F. C. Wellstood, Phys. Rev. B 67, 020509R (2003); F. W. Strauch, P. R. Johnson, A. J. Dragt, C. J. Lobb, J. R. Anderson, and F. C. Wellstood, Phys. Rev. Lett. 91, 167005 (2003).

[28] D. V. Averin and C. Bruder, Phys. Rev. Lett. 91, 057003 (2003).

[29] S. Russo, M. Kroug, T. M. Klapwijk, and A. F. Morpurgo, Phys. Rev. Lett. 95, 027002 (2005).

[30] S. E. Shafranjuk and J. B. Ketterson, Phys. Rev. B 72, 212506 (2005).

[31] G. Burkard, D. Loss, and E. V. Sukhorukov, Phys. Rev. B 61, R16303 (2000).

[32] Yu. Makhlin and G. Schön, Rev. Mod. Phys. 73, 357 (2001).

[33] G. A. Korn and T. M. Korn, *Mathematical Handbook for Scientists and Engineers* (McGraw-Hill, New York, 1968).

[34] E. Prada and F. Sols, Eur. Phys. J. B 40, 379 (2004).

[35] I. P. Nevirkovets, O. Chernyashevskyy, and J. B. Ketterson, IEEE Trans. Appl. Supercond. 15, 129 (2005); J. Appl. Phys. 97, 123903 (2005).

[36] I. P. Nevirkovets, S. E. Shafranjuk, and J. B. Ketterson, Phys. Rev. B 68, 024514 (2003).

[37] A. V. Svidzinsky, *Space-inhomogeneous Issues of the Superconducting Theory* (Science, Moscow, 1982) (in Russian).

[38] A. V. Zaitsev, Zh. Eksp. Teor. Fiz. 86, 1742 (1984) [Sov. Phys. JETP 59, 1015 (1984)].

[39] A. Shelankov and M. Ozana, Phys. Rev. B 61, 7077 (2000).

[40] S. E. Shafranjuk and J. B. Ketterson, Phys. Rev. B 72, 024509 (2005).

[41] R. Fazio, G. M. Palma, and J. Siewert, Phys. Rev. Lett. 83, 5385 (1999); J. Siewert, R. Fazio, G. M. Palma, and E. Sciacca, J. S. E. Shafranjuk Physical Review B 74, 024521 (2006) 024521-8 Low Temp. Phys. 118, 795 (2000); J. Siewert and R. Fazio, Phys. Rev. Lett. 87, 257905 (2001).

[42] F. Plastina, R. Fazio, and G. Massimo Palma, Phys. Rev. B 64, 113306 (2001).

[43] E. Merzbacher, *Quantum Mechanics* (Wiley, New York, 1998).

[44] C. S. Owen and D. J. Scalapino, Phys. Rev. 164, 538 (1967).

[45] K. K. Likharev, *Dynamics of Josephson Junctions and Circuits* [Gordon and Breach, New York, 1986].

[46] M. Steffen, J. M. Martinis, and I. L. Chuang, Phys. Rev. B 68, 224518 (2003).

[47] A. Peres, *Quantum Theory: Concepts and Methods* (Kluwer, Dodrecht, 1993).

[48] C. H. Bennett, H. J. Bernstein, S. Popescu, and B. Schumacher, Phys. Rev. A 53, 2046 (1996).

[49] I. Siddiqi, R. Vijay, F. Pierre, C. M. Wilson, M. Metcalfe, C. Rigetti, L. Frunzio, and M. H. Devoret, Phys. Rev. Lett. 93, 207002 (2004).

What is claimed is:

1. A multilayer structure with zirconium-oxide tunnel barriers, comprising:
   (a) a first niobium (Nb) layer;
   (b) a second niobium (Nb) layer; and
   (c) a stack of alternating layers of zirconium (Zr) and zirconium-oxide formed on the first niobium (Nb) layer by sequentially depositing a plurality of zirconium (Zr) layers followed by oxidation after each deposition and sandwiched between the first niobium (Nb) layer and the second niobium (Nb) layer, wherein the total number of layers of zirconium-oxide in the stack is greater than or equal to two, and each layer of zirconium (Zr) has a thickness that is less than 1 nm.

2. The multilayer structure of claim 1, wherein each layer of zirconium-oxide is formed by oxidizing a layer of zirconium that is deposited on another layer of zirconium or one of the first niobium (Nb) layer and the second niobium (Nb)

layer, and wherein the oxidation of a layer of zirconium is performed at a range of rate about 150 to 1500 Pa s.

3. The multilayer structure of claim 1, wherein each of the first niobium (Nb) layer and the second niobium (Nb) layer has a thickness, D, in the range of about 50 to 200 nm.

4. The multilayer structure of claim 3, wherein each of N layers of zirconium-oxide and M layers of zirconium has a thickness, d, which satisfies the relationship $D/d \geq 10$.

5. The multilayer structure of claim 1, further comprising a substrate, and wherein the first niobium (Nb) layer is deposited on the substrate.

6. A multilayer structure with zirconium-oxide tunnel barriers, comprising:
   (a) a first layer of metallic material;
   (b) a second layer of metallic material; and
   (c) a stack of alternating layers of zirconium (Zr) and zirconium-oxide formed on the first layer of metallic material by sequentially depositing a plurality of zirconium (Zr) layers followed by oxidation after each deposition and sandwiched between the first layer of metallic material and the second layer of metallic material, wherein the total number of layers of zirconium-oxide in the stack is greater than or equal to two, and each layer of zirconium (Zr) has a thickness that is less than 1 nm.

7. The multilayer structure of claim 6, wherein each layer of zirconium-oxide is formed on a layer of zirconium or one of the first layer of metallic material and the second layer of metallic material.

8. The multilayer structure of claim 6, wherein each of the first layer of metallic material and the second layer of metallic material has a thickness, D, in the range of about 50 to 200 nm.

9. The multilayer structure of claim 8, wherein each of N layers of zirconium-oxide and M layers of zirconium has a thickness, d, which satisfies the relationship $D/d \geq 10$.

10. The multilayer structure of claim 6, further comprising a substrate, and wherein the first layer of metallic material is deposited on the substrate.

11. The multilayer structure of claim 10, wherein each of the first layer of metallic material and the second layer of metallic material is selected from the group of metals consisting of niobium, niobium plus nitrogen, niobium plus tin, vanadium plus silicon, niobium plus nitrogen and carbon, niobium plus germanium, and niobium plus germanium and silicon.

* * * * *

UNITED STATES PATENT AND TRADEMARK OFFICE
CERTIFICATE OF CORRECTION

PATENT NO. : 7,977,668 B2  
APPLICATION NO. : 12/126726  
DATED : July 12, 2011  
INVENTOR(S) : Ivan Nevirkovets et al.

Page 1 of 1

It is certified that error appears in the above-identified patent and that said Letters Patent is hereby corrected as shown below:

In column 1, Lines 19-23, please delete:

"This invention was made with Government support under Contract No. EIA0218652 awarded by National Science Foundation of the United States. Accordingly, the United States Government has certain rights in this invention pursuant to this grant."

In column 1, Lines 19-23, please add:

--This invention was made with government support under grant number EIA0218652 awarded by the National Science Foundation. The government has certain rights in the invention.--

Signed and Sealed this  
Twenty-seventh Day of September, 2011

David J. Kappos  
*Director of the United States Patent and Trademark Office*